US007675371B2

(12) United States Patent
Wood

(10) Patent No.: US 7,675,371 B2
(45) Date of Patent: Mar. 9, 2010

(54) ELECTRONIC CIRCUITRY

(75) Inventor: John Wood, Santa Cruz, CA (US)

(73) Assignee: Multigig Inc., Scotts Valley, CA (US)

(*) Notice: Subject to any disclaimer, the term of this patent is extended or adjusted under 35 U.S.C. 154(b) by 0 days.

(21) Appl. No.: 11/198,877

(22) Filed: Aug. 5, 2005

(65) Prior Publication Data

US 2006/0082418 A1     Apr. 20, 2006

Related U.S. Application Data

(63) Continuation of application No. 10/167,200, filed on Jun. 11, 2002, which is a continuation-in-part of application No. 09/529,076, filed as application No. PCT/GB00/00175 on Jan. 24, 2000, now Pat. No. 6,556,089.

(30) Foreign Application Priority Data

| Jan. 22, 1999 | (GB) | ................................. 9901359.1 |
| Jan. 25, 1999 | (GB) | ................................. 9901618.0 |
| Jan. 30, 1999 | (GB) | ................................. 9902001.8 |

(51) Int. Cl.
    *H03K 3/03* (2006.01)
    *H01L 23/66* (2006.01)
(52) U.S. Cl. .............................. 331/46; 331/57; 331/50; 331/107 SL
(58) Field of Classification Search ................... 331/46, 331/57, 50, 107 SL
    See application file for complete search history.

(56) References Cited

U.S. PATENT DOCUMENTS

| 3,538,450 | A | 11/1968 | Andrea et al. ................. 331/10 |
| 3,516,021 | A | 6/1970 | Kohn |
| 4,246,550 | A | 1/1981 | Cohen ......................... 331/107 |
| 4,514,707 | A | 4/1985 | Dydyk et al. |
| 4,686,407 | A | 8/1987 | Ceperley |
| 4,749,963 | A | 6/1988 | Makimoto et al. ............ 331/99 |
| 4,875,046 | A | 10/1989 | Lewyn ........................ 341/148 |

(Continued)

FOREIGN PATENT DOCUMENTS

DE          4322701          7/1993

(Continued)

OTHER PUBLICATIONS

Active Matrix LCDs from www.wtec.org/loyola/displays/c3_s3.htm Date unknown.*

(Continued)

*Primary Examiner*—Michael B Shingleton
(74) *Attorney, Agent, or Firm*—IPxLaw Group LLP

(57) ABSTRACT

Electronic circuitry comprising operational circuits of active switching type requiring timing signals, and conductive means for distributing said timing signals to the operational circuits, wherein the timing signal distribution means includes a signal path that has different phases of a drive signal are supplied via active means at different positions about the signal path where that path exhibits endless electromagnetic continuity without signal phase inversion or has interconnections with another signal path having different substantially unidirectional signal flow where there is no endless electromagnetic continuity between those signal paths and generally has non-linear associated circuit means where the signal path is of a transmission line nature.

11 Claims, 28 Drawing Sheets

U.S. PATENT DOCUMENTS

| | | | | |
|---|---|---|---|---|
| 5,117,206 | A | 5/1992 | Imamura | 331/158 |
| 5,235,335 | A | 8/1993 | Hester et al. | 341/172 |
| 5,361,277 | A | 11/1994 | Grover | 375/356 |
| 5,493,715 | A | 2/1996 | Humphreys et al. | 455/264 |
| 5,546,023 | A | 8/1996 | Borkar et al. | 326/93 |
| 5,584,067 | A | 12/1996 | Buer et al. | |
| 5,640,112 | A | 6/1997 | Goto et al. | |
| 5,652,549 | A | 7/1997 | Unterricker et al. | |
| 5,754,833 | A | 5/1998 | Singh et al. | 395/551 |
| 5,945,847 | A | 8/1999 | Ransijn | 326/115 |
| 5,963,086 | A | 10/1999 | Hall | 330/10 |
| 5,973,633 | A | 10/1999 | Hester | 341/172 |
| 6,078,202 | A | 6/2000 | Tomatsuri et al. | 327/145 |
| 6,133,798 | A | 10/2000 | Nagano et al. | |
| 6,239,663 | B1 | 5/2001 | Mizutani | 331/107 |
| 6,259,327 | B1 | 7/2001 | Balistreri et al. | 331/11 |
| 6,525,618 | B2 | 2/2003 | Wood | |
| 6,556,089 | B2 | 4/2003 | Wood | |
| 6,683,503 | B2 | 1/2004 | Mizuno et al. | 331/46 |
| 2003/0128075 | A1 | 7/2003 | Wood | |
| 2004/0233022 | A1* | 11/2004 | Tsuzuki et al. | 333/204 |

FOREIGN PATENT DOCUMENTS

| | | |
|---|---|---|
| EP | 0583839 | 2/1994 |
| EP | 0633662 | 1/1995 |
| EP | 0696843 | 2/1996 |
| EP | 0478134 | 6/1997 |
| EP | 0891045 | 1/2002 |
| GB | 1247199 | 9/1971 |
| GB | 2358562 | 7/2001 |
| JP | 60224205 | 11/1985 |
| JP | 4165809 | 6/1992 |
| WO | WO 95/12263 | 5/1995 |
| WO | WO 00/44093 | 7/2000 |

OTHER PUBLICATIONS

Transistors from www.electronics-turorials.com.*

Divina et al., "The Distributed Oscillator at 4 GHZ," 1998 *IEEE*, Department Electromagnetic Field, Czech Technical University in Prague Teehnicka 2, 166 27 Praha 6, Czech Republic.

Hall, L et al. "Clock Distribution Using Cooperative Ring Oscillators," *Proceedings of the 17th Conference on Advanced Research in VLSI*, Ann Arbor, MI, Sept. 15-16, 1997, pp. 62-75.

Kato, Hatsuhiro: "A Dynamic Formulation of Ring Oscillator as Solitary-Wave Propagator," *IEEE Transactions on Circuits and Systems-I: Fundamental Theory and Applications*, vol. 45, No. 1, Jan. 1998, pp. 98- 101.

Larsson, H., "Distributed Synchronous Clocking using Connected Ring Oscillators, Master's thesis in Computer Systems, Engineering", *Centre for Computer Systems Architecture, Halmstad University*, Jan. 1997, pp. 1-43 (*i-x*).

Yabuki et al.: "Miniaturized Stripline Dual-Mode Ring Resonators and Their Application to Oscillating Devices," *IEEE*, May 16, 1995, pp. 1313-1316.

Bussmann et al., 1992, "Active Compensation of Interconnect Losses for Multi-GHz Clock Distribution Networks," IEEE T. Circuits Syst - II: Analog and Digital Signal Processing, 39(11 ):790-798.

Deutsch et al., Sep 1995 "Modeling and Characterization of Long On-Chip Interconnections for High-Performance Microprocessors," IBM J. Res. Develop. 39(5):547-567.

Dunning, Apr 1995, "An All-Digital Phase-Locked Loop with 50-Cycle Lock Time Suitable for High-Performance Microprocessors," IEEE J. of Solid-State Circuits 30(4):412-422.

Kim et al.., 2000, "WP 26.3 A Low-Phase-Noise CMOS LC Oscillator with a Ring Structure," IEEE Int. Solid-State Circuits Conference, 3 pp.

Kleveland et al.., 1999, "Line Inductance Extraction and Modeling in Real Chip With Power Grid," IEEE IEDM Conference, Washington, D.C. pp. 1-4.

Kleveland et al.., 1999, "Monolithic CMOS Distributed Amplifier and Oscillator, "IEEE Int. Solid-State Circuits Conference MP 4.3, 9 pp.

Kleveland et al., Jun 1998, "50-GHz Interconnect Design in Standard Silicon Technology," IEEE MIT-S Int. Microwave Symposium, Baltimore, Maryland, igest 3:1913-1916.

Kral et al.., 1998, "RF-CMOS Oscillators with Switched Tuning," P. IEEE Custom Integrated Circuits Conference, pp. 555-558.

Miller, Jun. 1991,"A Multiple Modulator Fractional Divider," IEEE T. Instru. Meas. 40(3):578-583.

Nagashino et al.., Mar 1993, "Generation of Traveling Wave Mode in a Chained Neural Oscillator Network Model," Proc. of the Int. Conference of Neural Networks, IEEE pp. 1550-1557.

Skvor et al., Aug 1992, "Novel Decade Electronically Tunable Microwave Oscillator Based on the Distributed Amplifier," IEEE Explore, vol. 28, Issue 17 Abstract.

Wilson et al., Oct 2000, "A CMOS Self-Calibrating Frequency Synthesizer," IEEE J Solid-St Circ 35(10):1437-1444.

Wood et al.., Nov 2001, "Rotary Traveling-Wave Oscillator Arrays: A New Clock Technology," IEEE J Solid-8t Cire 36 (11):1654-1665.

Yue et al., 1998, "On-Chip Spiral Inductors with Patterned Ground Shields for Si-Based RF IC's," IEEE J Solid-St Circ 33(5):743-752.

* cited by examiner

ELECTRONIC CIRCUITRY

CROSS REFERENCE TO RELATED APPLICATIONS

This application is a continuation of U.S. application Ser. No. 10/167,200 filed on Jun. 11, 2002, titled "ELECTRONIC TIMING SIGNAL CIRCUITRY" which application is itself a continuation-in-part of U.S. application Ser. No. 09/529,076, filed on Apr. 6, 2000, titled "ELECTRONIC CIRCUITRY", now U.S. Pat. No. 6,556,089, which application is a national stage application of international application PCT/GB00/00175, filed on Jan. 24, 2000, titled "ELECTRONIC CIRCUITRY," which international application claims priority to three Great Britain applications, GB9902001.8, filed on Jan. 30, 1999, GB9901618.0, filed on Jan. 25, 1999, and GB9901359.1, filed on Jan. 22, 1999.

The following applications are incorporated by reference into the present application:
  U.S. application Ser. No. 10/167,200 filed on Jun. 11, 2002, titled "ELECTRONIC TIMING SIGNAL CIRCUITRY";
  U.S. application Ser. No. 09/529,076, filed on Apr. 6, 2000, titled "ELECTRONIC CIRCUITRY", now U.S. Pat. No. 6,556,089;
  International application PCT/GB00/00175, filed on Jan. 24, 2000, titled "ELECTRONIC CIRCUITRY";
  GB9902001.8, filed on Jan. 30, 1999;
  GB9901618.0, filed on Jan. 25, 1999; and
  GB9901359.1, filed on Jan. 22, 1999.

This application develops inventive features inherent in U.S. application Ser. No. 09/529,076. One such inventive feature concerns coupling synchronously between traveling electromagnetic waves. In application Ser. No. 09/529,076, endless signal paths exhibit electromagnetic continuity and afford signal inversion during recirculation of those paths, specifically coupling between such signal paths at positions that sustain and reinforce directionality of signal recirculations and correlation of their phasing. Suitable signal paths of a transmission-line nature comprise conductors in parallel relation, usually conductive traces of prescribed dimensions and spacing.

FIELD OF INVENTION

This invention relates to generating electrical signal waveforms applicable, but not necessarily only applicable, to use for timing purposes, including (but not limited to) providing so-called clock signals on semiconductor integrated circuits.

BACKGROUND TO INVENTION

SUMMARY OF INVENTION

As now developed herein, operationally effective directionality and phase correlation is achieved and reinforced for traveling electromagnetic waves not of wholly recirculatory nature, thus for effective signal paths that are not electromagnetically endless.

Typically, in implementing this inventive feature, there are multiple interconnections of signal paths each of a substantially unidirectional signal transmission nature, the inter-connections being made plurally between nominally phase-correlated positions for signal paths having different unidirectional signal flows.

In one embodiment, a signal path of a transmission-line nature and having substantially unidirectional signal energy flow is coupled to another signal path which is of a similar nature having opposite substantially unidirectional signal energy flow herein referred to as "contra-flow". Suitable coupling is by active interconnection(s) at position(s) for phase-correlation of respective opposed signal energy flows. Generally, plural such interconnection positions will have a spaced relation along the respective signal paths, with their spacings correlated as periodic intervals relative to signal traverse of those paths.

Suitable lay-outs of such transmission-line signal paths can have localized adjacencies at their interconnection positions, and can be otherwise spaced to afford areas circumscribed by parts of the contra-flow signal paths that afford an inversion effect then effectively similar to that of the endless electromagnetically continuous path specifically disclosed in application Ser. No. 09/529,076. Suitable such localized adjacencies can be achieved where the signal paths or part-paths are of a stepped nature that brings interconnection positions close together, typically at tops and bottoms of steps of the stepped paths or path-parts concerned. Ends of paired conductor type transmission line parts can be loop-connected together to form opposite directions of signal flow paths or path-parts, and/or have terminations, say at ends of such loop-connected paths or path-parts.

Suitable interconnections can be by way of cross-couplings using non-linear devices as a phase-locking mechanism that induces local wave-form generation or oscillation, and may be of a transistor nature. Preferred interconnections or cross-couplings are by way of means that gate energy to and from voltage supplies alternatively or additionally to passing energy directly between the signal energy contra-flows in the signal paths concerned. Inverter type interconnection circuits can afford both switching and amplification actions, say advantageously effective to supply one direction of signal energy flow while absorbing reverse components in a laser-like action.

The endless electromagnetically continuous inverting signal paths of application Ser. No. 09/529,076 and their reactive interconnections of component conductive elements combine to afford integration of signal wave-form generation and distribution, advantageously (but not necessarily) of inherently fast rise/fall nature providing a remarkable good substantially "square" wave-form even at very high plural-GigaHertz effective frequencies. The contra-flow implementation of this invention can be in conjunction with use of an external exciter to launch the traveling waves.

Another inventive feature inherent in application Ser. No. 09/529,076 and now further developed and generalized in this continuation-in-part application concerns rotation locking as such. Application Ser. No. 09/529,076 achieves rotation directionality in conjunction with energy conservation of its recirculatory signal energy flows combined with signal generation, as specifically afforded by its endless electromagnetically continuous inverting signal paths.

However, signal rotation directionality can be achieved and maintained by plural application of separately provided timing signals at prescribed positions spaced along a signal path for traveling electromagnetic waves that is typically endless but need not be of a nature applying signal inversion.

Typically, in implementing this inventive feature, three phases of input timing signals are connected at an endless non-inverting signal path at positions appropriate to their phases.

A signal path comprising dual parallel conductive components, typically traces, can, as for the endless inverting signal paths of application Ser. No. 09/529,076 and the above contra-flow inventive feature, provide differential signal waveforms at correlated take-off positions along the path. To this end, the plural phase input timing signals are supplied with phase inversion to the two conductive components/traces, respectively at correlation positions along the path. Bipolar such input timing signals can be effective to make bipolar said wave-forms available round endless signal paths.

A signal path comprising a single conductive trace could, of course, provide a single-ended rather than differential signal path wave-form.

Another distinguishing feature is shared with the endless electromagnetically continuous inverting signal paths of application Ser. No. 09/529,076 and the contra-flow unidirectional signal paths and the plural-phase input signal provisions of this application. This other distinguishing feature is the use of signal paths of a transmission-line nature in association with non-linear active circuit elements. Such non-linear active provision can assist in sustaining signal flow energy, whether at application of plural phases to positions spaced along an endless electromagnetically continuous signal path or in cross-connections between phase correlated positions along conductive signal path components, as for dual conductive components/traces of signal paths as such in either of the rotationally endless electromagnetic continuity context of application Ser. No. 09/529,076 or in the contra-flow context of the first above feature hereof, or in the interconnections between unidirectional signal paths of that feature hereof.

The cross-connections between dual conductive components/traces of preferred transmission line signal paths serve to continuously refresh a traveling voltage transition, preferably as very sharp voltage transition as required for rise and fall of highly square wave-forms desirable for clocking purposes. The interval between two opposite such transitions, or the actual or effective inversions of a single transition, set the half-cycle time of a resulting wave-form that can be of bipolar nature.

Moreover, such transition regenerative action, along with take-off in the manner of tapping into a passing wave-form, will be conservative of power requirements as a feature of timing signal distribution. This is particularly advantageous for a large number of areally distributed signal path provisions as can serve a large area semiconductor integrated circuit, say of very large scale (VLSI) type. The above contra-flow embodiment is, of course, as in-principle readily arrayable as the endless electromagnetically continuous inverting signal paths with hard-wired interconnects of application Ser. No. 09/529,076, with which it has high effective equivalence in terms of timing signal take-off, though increasing the strength of its ordinary interconnections or cross-couplings would necessarily to some extent sacrifice chip area and increase power requirements.

Whilst the capability of the emphasized subject matter of application Ser. No. 09/529,076 to operate at very high plural-GHz rates is shared by the above one and further inventive features now emphasized herein, i.e. as inherently common to all three, the absence of integrated wave-form generation represented by requirement for a separately generated input timing signal in the subject matter introduced herein could be seen as leaving the matter of high-speed for such separate timing signal provision unaddressed. However, there are and almost certainly always will be, special technologies and fabrications that can provide such a high speed source, albeit especially likely much more expensively and with less technologically coherence compared with the emphasized subject matter of application Ser. No. 09/529,076. However, the additional subject matter hereof does have application capability in such manner.

It is feasible for the requisite stable high-frequency phase-reliable separate timing signal source to be of the nature emphasized in application Ser. No. 09/529,076, then to have technical coherence with the additional subject matter hereof, which is applicable as extension(s) of whatever provision is made by way of the emphasized subject matter of application Ser. No. 09/529,076.

BRIEF DESCRIPTION OF DRAWINGS

FIGS. 7(i)–7(ix) are idealized graphs illustrating the phase of related signal waveforms;

FIG. 14b shows an equivalent circuit diagram for FIG. 14a;

FIG. 18 is a diagrammatic equivalent representation for FIG. 17a;

FIG. 35b shows drive waveforms for the circuit of FIG. 35a.

DETAILED DESCRIPTION FOR ILLUSTRATED EMBODIMENTS

Referring first to FIGS. 1–33, FIG. 1 shows a transmission-line 15 that is neither terminated nor open-ended, nor even un-terminated as such term might be understood hitherto. As un-terminated, at least for use as in FIGS. 1–33, such transmission lines are seen as constituting a structural aspect of invention, including by reason of affording a signal path exhibiting endless electromagnetic continuity.

Figure 1:
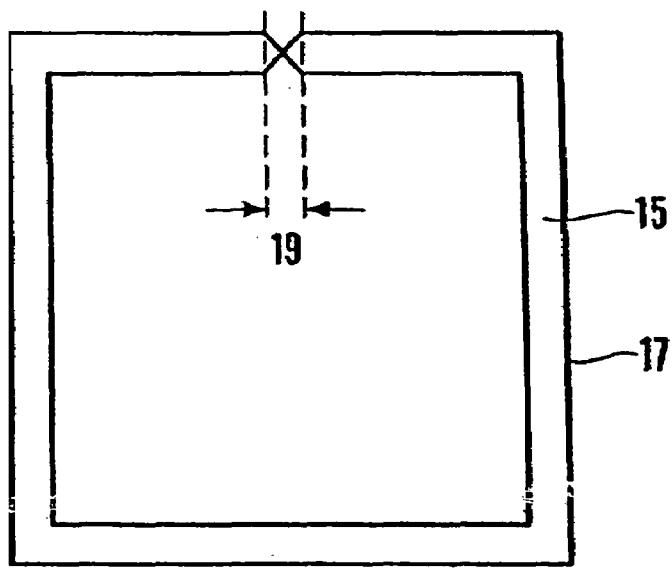
FIG. 1 is an outline diagram for one transmission-line structure hereof.

The transmission-line 15 of FIG. 1 is physically endless, specifically comprising a single continuous "originating" conductor formation 17 shown forming two appropriately spaced generally parallel traces as loops 15a, 15b with a cross-over at 19 that does not involve any local electrical connection of the conductor 17. As shown, the length of the originating conductor 17 (taken as S), corresponds to two 'laps' of the transmission-line 15 as defined between the spaced loop traces 15a, 15b and through the cross-over 19.

Figure 2:
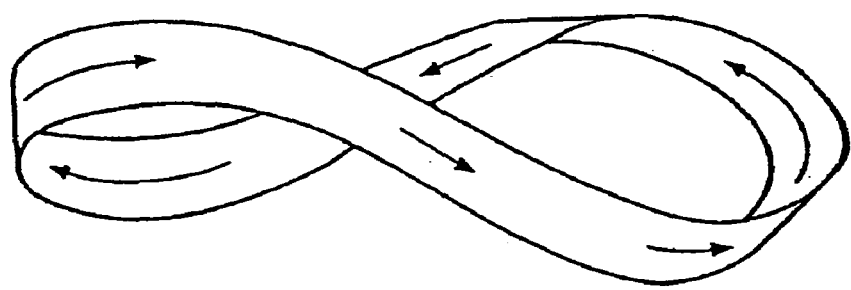
FIG. 2 shows a Moebius strip.

This structure of the transmission-line 15 has a planar equivalence to a Moebius strip, see FIG. 2, where an endless strip with a single twist through 180.degree. has the remarkable topology of effectively converting a two-sided and two-edged, but twisted and ends-joined, originating strip to have only one side and one edge, see arrows endlessly tracking the centre line of the strip. From any position along the strip, return will be with originally left- and right-hand edges reversed, inverted or transposed. The same would be true for any odd number of such twists along the length of the strip. Such a strip of conductive material would perform as required for signal paths of first preferred embodiments of this invention, and constitutes another structural aspect of invention. A flexible substrate would allow implementing a true Moebius strip transmission-line structure, i.e. with graduality of twist that could be advantageous compared with planar equivalent cross-over 19. A flexible printed circuit board so formed and with its ICs mounted is seen as a feasible proposition.

Figure 3:
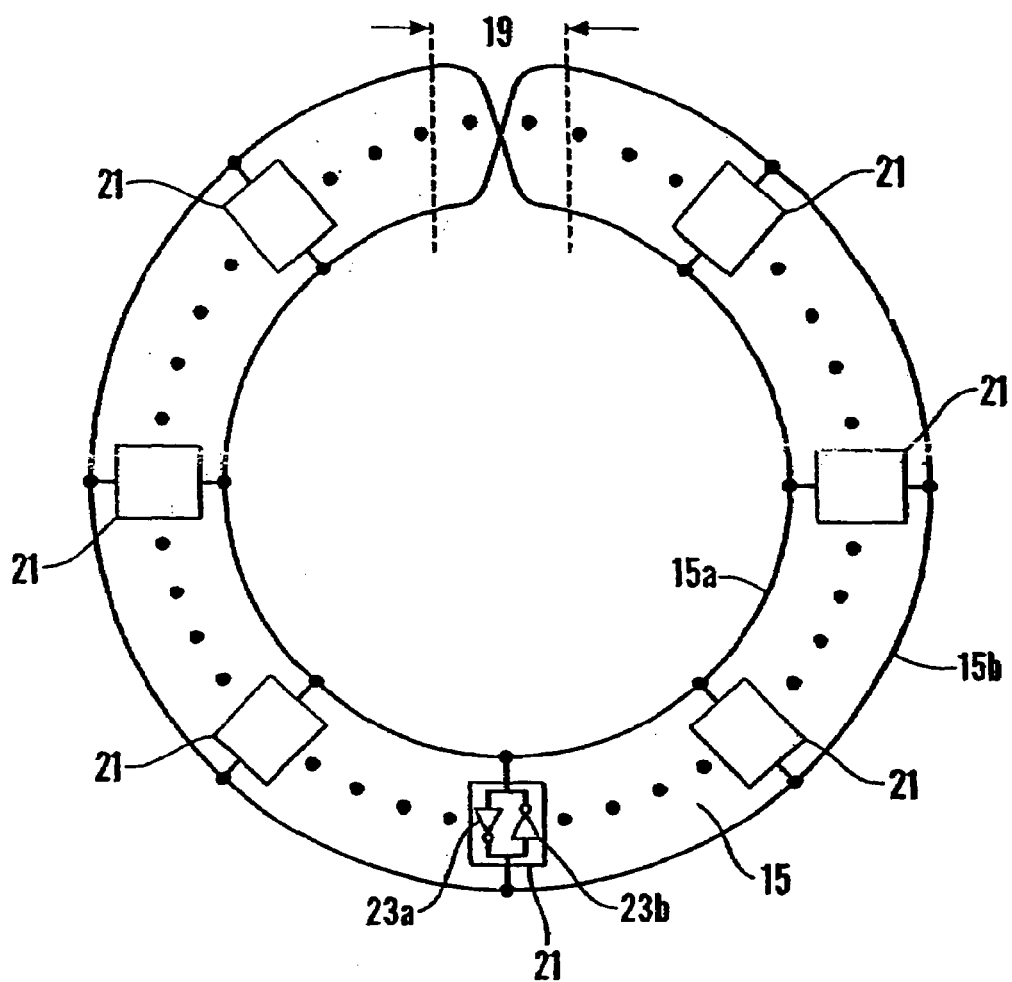
FIG. 3 is an outline circuit diagram for a traveling wave oscillator.

FIG. 3 is a circuit diagram for a pulse generator, actually an oscillator, using the transmission-line 15 of FIG. 1, specifically further having plural spaced regenerative active means conveniently as bi-directional inverting switching/amplifying circuitry 21 connected between the conductive loop traces 15a, 15b. The circuitry 21 is further illustrated in this particular embodiment as comprising two inverters 23a, 23b that are connected back-to-back. Alternatives regenerative means that rely on negative resistance, negative capacitance or are otherwise suitably non-linear, and regenerative (such as Gunn diodes) or are of transmission-line nature. It is preferred that the circuitry 21 is plural and distributed along the transmission-line 15, further preferably evenly, or substantially evenly; also in large numbers say up to 100 or more, further preferably as many and each as small as reasonably practical.

Inverters 23a, 23b of each switching amplifier 21 will have the usual operative connections to relatively positive and negative supply rails, usually V+ and GND, respectively. Respective input/output terminals of each circuit 21 are shown connected to the transmission-line 15 between the loops 15a, 15b at substantially maximum spacing apart along the effectively single conductor 17, thus each at substantially halfway around the transmission-line 15 relative to the other.

Figure 4:
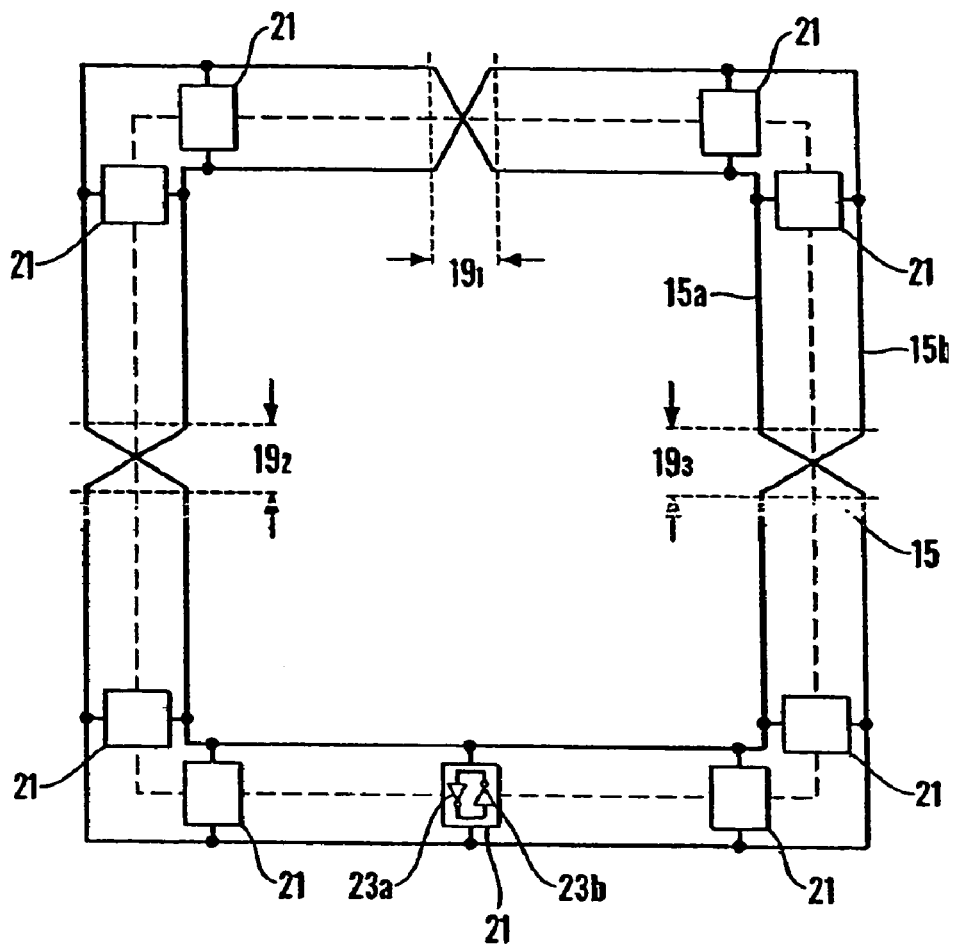
FIG. 4 is another outline circuit diagram for a traveling wave oscillator.

FIG. 4 is another circuit diagram for an oscillator using a transmission-line structure hereof, but with three crossovers 19a, 19b and 19c, thus the same Moebius strip-like reversing/inverting/transposing property as applies in FIG. 3.

The rectangular and circular shapes shown for the transmission-line 15 are for convenience of illustration. They can be any shape, including geometrically irregular, so long as they have a length appropriate to the desired operating frequency, i.e. so that a signal leaving an amplifier 21 arrives back inverted after a full 'lap' of the transmission-line 15, i.e. effectively the spacing between the loops 15a,b plus the crossover 19, traversed in a time Tp effectively defining a pulse width or half-cycle oscillation time of the operating frequency.

Advantages of evenly distributing the amplifiers 21 along the transmission-line 15 are twofold. Firstly, spreading stray capacitance effectively lumped at associated amplifiers 21 for better and easier absorbing into the transmission-line characteristic impedance Zo thus reducing and signal reflection effects and improving poor waveshape definition. Secondly, the signal amplitude determined by the supply voltages V+ and GND will be more substantially constant over the entire transmission-line 15 better to compensate for losses associated with the transmission-lines dielectric and conductor materials. A continuous closed-loop transmission-line 15 with regenerative switching means 21 substantially evenly distributed and connected can closely resemble a substantially uniform structure that appears the same at any point. A good rule is for elementary capacitance and inductance (Ce and Le) associated with each regenerative switching means and forming a resonant shunt tank LC circuit to have a resonant frequency of $1/[2*pi*SQRT(Le/Ce)]$ that is greater than the self-sustaining oscillating frequency F (F3, F5 etc.) of the transmission-line 15.

Figure 5A:
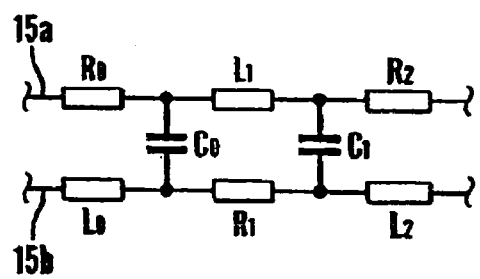
FIGS. 5a and 5b are equivalent circuits for distributed electrical models of a portion of a transmission-line of FIGS. 1–4.

FIG. 5a is a distributed electrical equivalent circuit or model of a portion of a transmission-line 15 hereof. It shows alternate distributed resistive (R) and inductive (L) elements connected in series, i.e. $R_0$ connected in series with $L_1$ in turn connected in series with $R_2$ and so on for a portion of loop 15a, and registering $L_0$ connected in series with $R_1$ in turn connected in series with $L_2$ and so on for the adjacent portion of loop 15b; and distributed capacitive elements $C_0$ and $C_1$ shown connected in parallel across the transmission-line 15 thus to the loops 15a and 15b between the resistive/inductive elements $R_0/L_1$ and the inductive/resistive elements $L_0/R_1$, respectively for $C_0$, and between the inductive/resistive elements $L_1/R_2$ and the resistive/inductive elements $R_1/L_2$, respectively for $C_1$: where the identities $R0=R1=R2$, $L1=L2=L3$ and $C0=C1$ substantially hold and the illustrated distributed RLC model extends over the whole length of the transmission-line 15. Although not shown, there will actually be a parasitic resistive element in parallel with each capacitive element C, specifically its dielectric material.

Figure 5B:
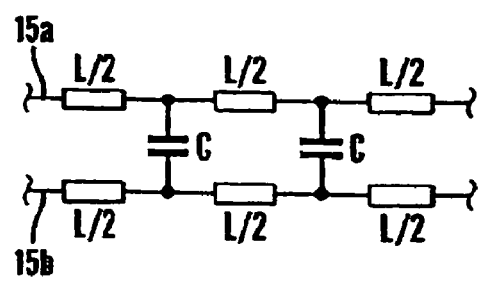

FIG. 5b is a further simplified alternative distributed electrical equivalent circuit or model that ignores resistance, see replacement of those of FIG. 5a by further distribution of inductive elements in series at half (L/2) their value (L) in FIG. 5a. This model is useful for understanding basic principles of operation of transmission-lines embodying the invention.

During a 'start-up' phase, i.e. after power is first applied to the amplifiers 21, oscillation will get initiated from amplification of inherent noise within the amplifiers 21, thus begin substantially chaotically though it will quickly settle to oscillation at a fundamental frequency F, typically within nanoseconds. For each amplifier 21, respective signals from its inverters 23a and 23b arrive back inverted after experiencing a propagation delay Tp around the transmission-line 15. This propagation delay Tp is a function of the inductive and capacitive parameters of the transmission-line 15; which, as expressed in henrys per meter (L) and in farads per meter (C) to include all capacitive loading of the transmission-line, lead to a characteristic impedance Zo=SQR (L/C) and a line traverse or propagation or phase velocity Pv=1/SQRT(L*C). Reinforcement, i.e. selective amplification, of those frequencies for which the delay Tp is an integer sub-divisor of a half-cycle time gives rise to the dominant lowest frequency, i.e. the fundamental frequency F=1/(2.multidot.Tp), for which the sub-divisor condition is satisfied. All other integer multiples of this frequency also satisfy this sub-divisor condition, but gain of the amplifiers 21 'falls off', i.e. decreases, for higher frequencies, so the transmission-line 15 will quickly settle to fundamental oscillation at the frequency F.

The transmission-line 15 has endless electromagnetic continuity, which, along with fast switching times of preferred transistors in the inverters 23a and 23b, leads to a strongly square wave-form containing odd harmonics of the fundamental frequency F in effectively reinforced oscillation. At the fundamental oscillating frequency F, including the odd harmonic frequencies, the terminals of the amplifiers 21 appear substantially unloaded, due to the transmission-line 15 being 'closed-loop' without any form of termination, which results very desirably in low power dissipation and low drive requirements. The inductance and capacitance per unit length of the transmission-line 15 can be altered independently, as can also be desirable and advantageous.

Figure 6A:
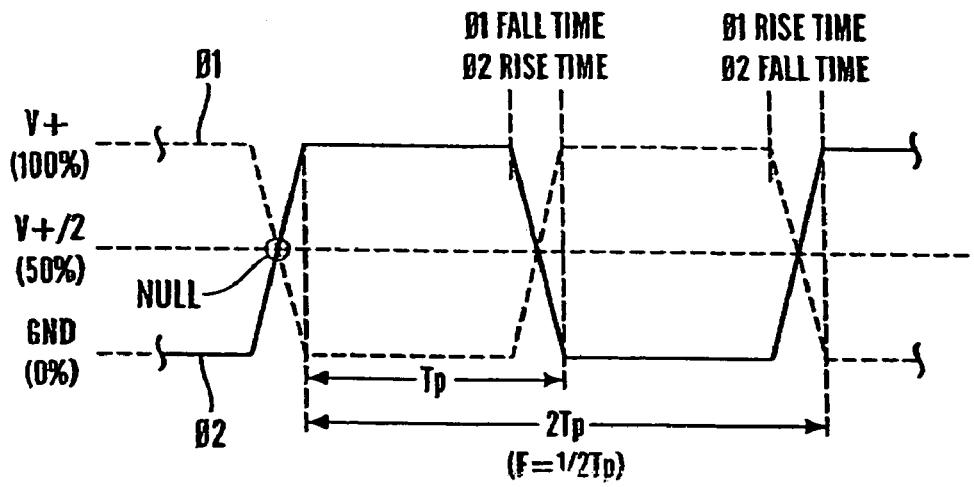
FIG. 6a shows related idealized graphs for respective differential output waveforms.

FIG. 6a shows idealized waveforms for a switching amplifier 21 with inverters 23a and 23b Component oscillation waveforms .PHI.1, .PHI.2 appear at the input/output terminals of that amplifier 21 shortly after the 'start-up' phase, and continue during normal operation. These waveforms .PHI.1 and .PHI.2 are substantially square and differential, i.e. two-phase inverse in being 180 degrees out-of-phase These differential waveforms .PHI.1 and .PHI.2 cross substantially at the mid-point (V+/2) of the maximum signal amplitude (V+). This mid point (V+/2) can be considered as a 'null' point since the instant that both the waveforms .PHI.1 and .PHI.2 are at the same potential, there is no displacement current flow present in nor any differential voltage between the conductive loop traces 15a and 15b. For the preferred recirculating traveling wave aspect of this invention, this null point effectively sweeps round the transmission line 15 with very fast rise and fall times and a very 'clean' square-wave form definition. This null point is also effectively a reference voltage for opposite excursions of a full cycle bipolar clock signal.

Figure 6B:
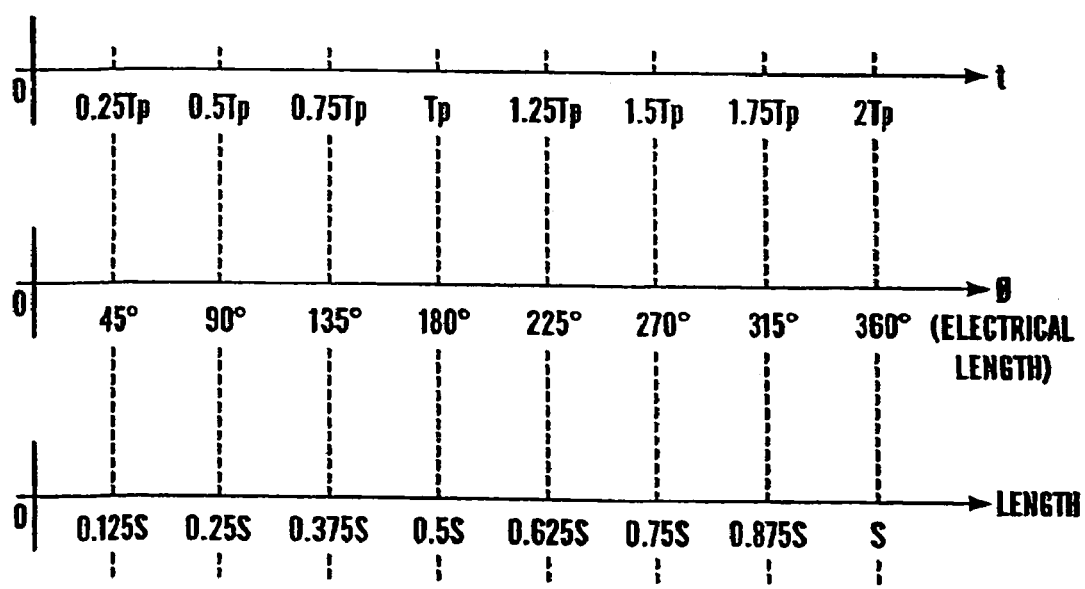
FIG. 6b illustrates relationship between propagation delay, electrical length and physical length of a transmission-line of FIGS. 1–4.

For the transmission-line 15, it is convenient to consider complete laps as traversed by a traveling wave, and also total length S of the originating conductive trace 17, both in terms of 'electrical length'. FIG. 6b shows relationships between the propagation delay or traverse time (Tp), electrical length in degrees, and physical length (S) of originating conductive line/trace 17. For each of the out-of-phase waveforms .PHI.1 and .PHI.2, and as seen by a traveling wave repeatedly traversing the transmission-line 15, each substantially square wave excursion corresponds to one complete lap, i.e. one traverse time Tp, and successive opposite wave excursions require two consecutive laps, i.e. two traverse times (2.times.Tp). One lap of the transmission-line 15 thus has an 'electrical length' of 180 degrees, and two laps are required for a full 0.degree.–360.degree. bipolar signal cycle, i.e. corresponding to the full lengths of the originating conductor 17.

By way of example, an electrical length of 180.degree. corresponding to one lap and ½ wavelength at 1 GHz could be formed from a 45 mm transmission-line having a phase velocity (Pv) that is 30% that of the speed of light (c), i.e. Pv=0.3*c, or 4.5 mm where Pv=0.03*c, or 166 mm in free space, i.e. where Pv=1*c.

Figure 7:
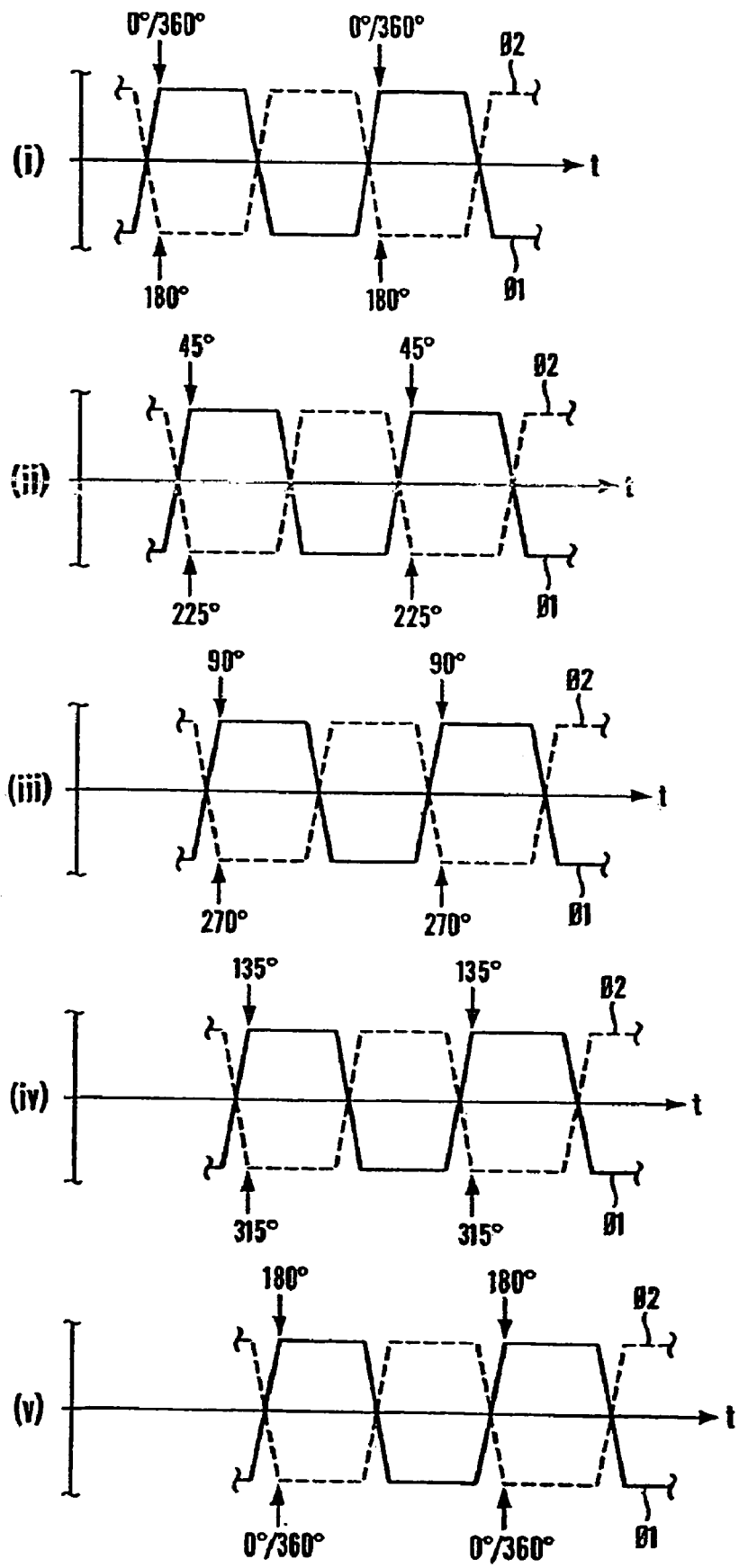
Figure 7:
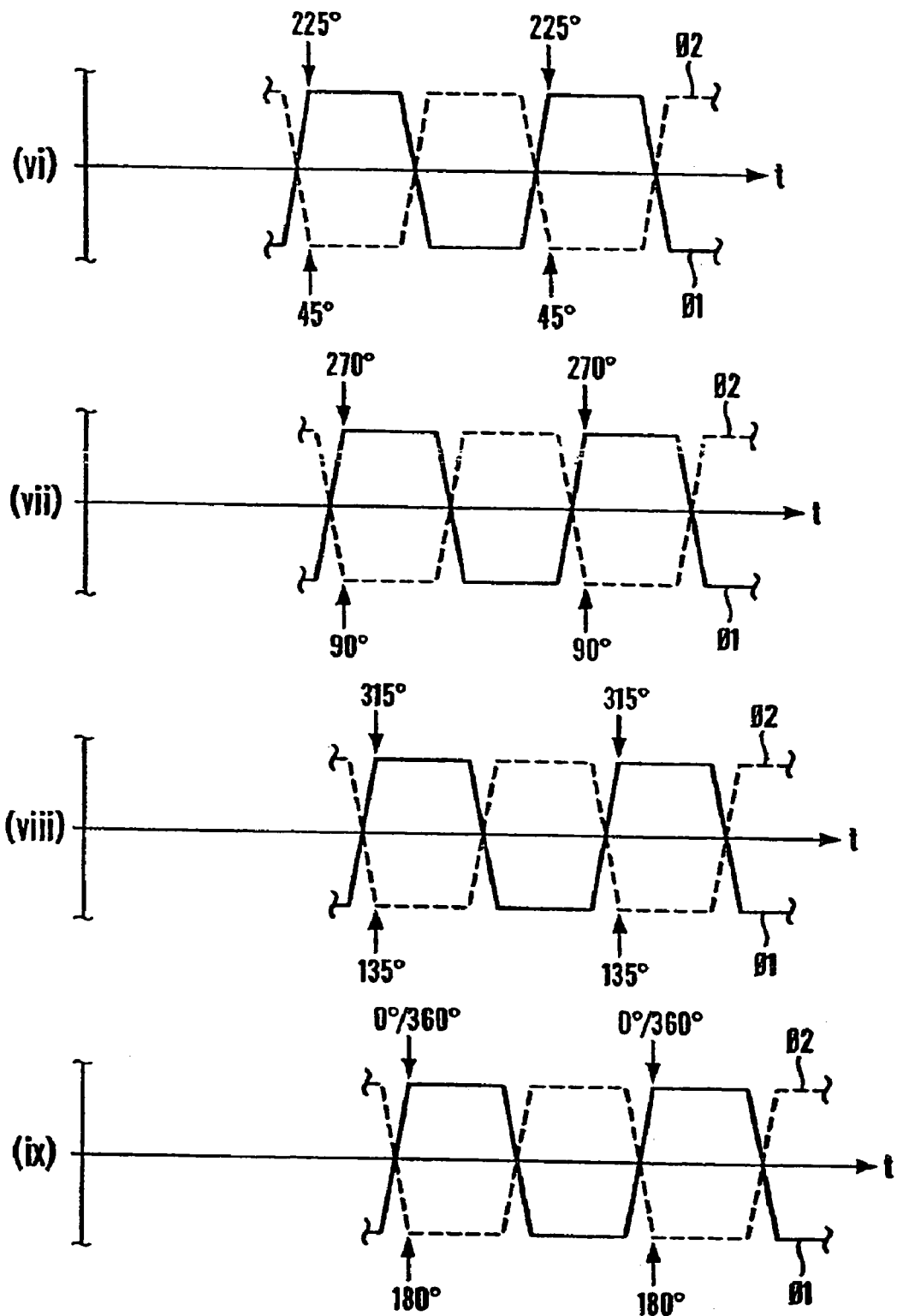

FIGS. 7(i)–7(ix) show waveforms .PHI.1, .PHI.2 through a full cycle to start of the next cycle, specifically at eight equal electrical-length spacings of 45 degrees between sample positions along the conductor line or trace 17. Phase labeling are relative to FIG. 7(i) which can be anywhere along the trace 17, i.e. twice round the transmission line 15, as such, and 0/360-degrees for rise/fall of the .PHI.1, .PHI.2 waveforms 15 is arbitrarily marked. Taking FIG. 7(i) as time t0, FIG. 7(ii) shows the waveforms .PHI.1, .PHI.2 at time t0+(0.25 Tp) after one-eighth (0.125 S) traverse of total length S of the line 17, thus traverse of one-quarter of the transmission line 15, and 45-degrees of electrical length. Times t0+(0.5 Tp), t0+(0.75 Tp), t0+(0.75 Tp) . . . t0+(2 Tp); traverses 0.25 S, 0.375 S, 0.5 S . . . 1.0 S and 90, 135, 180 . . . 360-degrees should readily be seen self-evidently to apply to FIGS. 7(iii)–(ix), respectively.

Figure 8A:
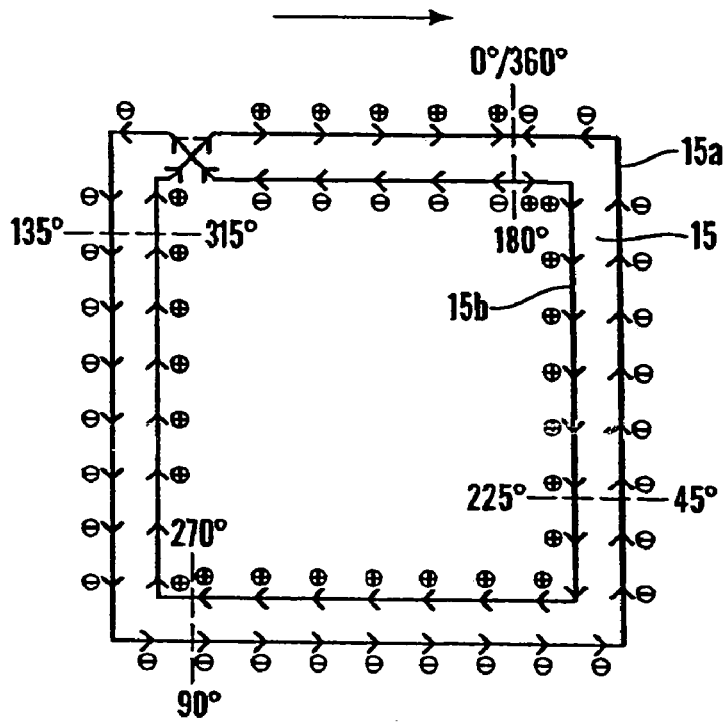
FIGS. 8a, 8b illustrate instantaneous phasing of one waveform in a transmission-line oscillator.
Figure 8B:
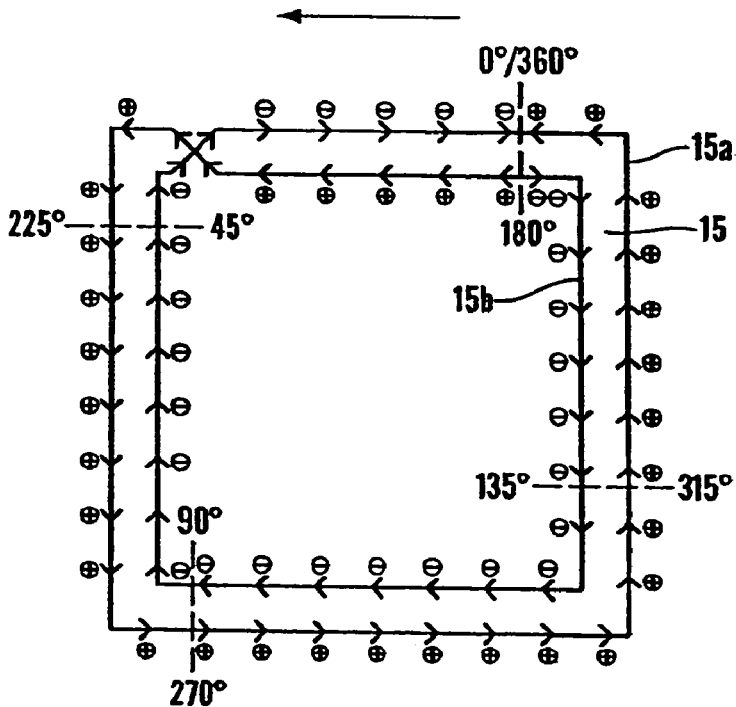

FIGS. 8a and 8b show snap-shots of excursion polarity (shown circled), displacement current flow (shown by light on-trace arrows), and instantaneous phasing from an arbitrary 0/360-degree position on the electromagnetically endless transmission line 15 covering two laps thereof (thus the full length the continuous originating conductor 17). Only one differential traveling electromagnetic (EM) waveform (say .PHI.1) of FIG. 7 is shown, but for rotation propagation around the transmission-line 15 in either of opposite directions, i.e. clockwise or counter-clockwise. The other waveform (Φ2) will, of course be 180.degree. out of phase with the illustrated waveform (Φ1). The actual direction of rotation of the EM wave will be given by Poyntings' vector, i.e. the cross product of the electric and magnetic vectors. The crossover region 19 produces no significant perturbation of the signals Φ1 or Φ2 as the EM wave traverses this region 19. In effect, the fast rise/fall transitions travel round the transmission-line at phase velocity Pv, the switching amplifiers 21 serving to amplify the transitions during first switching between supply voltage levels.

The phases of the waveforms Φ1 and Φ2 can, for a transmission-line 15 hereof, be accurately determined from any arbitrary reference point on the transmission-line 15, thus have strong coherence and stability of phasing.

Suitable (indeed preferred in relation to present IC manufacturing technology and practice) switching amplifiers 21 for bidirectional operation are based on back-to-back Mosfet inverters 23a,b, for which up to well over 1,000 switching inverting amplifier pairs could be provided along typical lengths of transmission-line structures hereof.

The bidirectional inverting action of the switching amplifiers 21 is of synchronous rectification nature. The rise and fall times of the waveforms Φ1 and Φ2 are very fast indeed compared with hitherto conventional timing signals, being based on electron-transit-time of preferred Mosfet transistors of the inverters 23a,b. Moreover, reinforcement is related to the transmission-line 15 having lower impedance than any 'on' transistor in inverters of preferred bidirectional switching amplifiers 21, though total paralleled is usefully of the same order. Switching of such inverters means that each amplifier 21 contributes to the resulting wave polarity by way of a small energy pulse which, by symmetry, must propagate in both directions, the forwardly directed EM wave pulse thus contributing as desired. The reverse EM wave pulse that travels back to the previously switched amplifier 21 is of the same polarity as already exists there, thus reinforces the preexisting switched state. Ohmic paths between power supply rails and the transmission line 15 through 'on' transistors of the preferred inverters of amplifiers 21 ensure that energy of such reverse EM wave pulses is absorbed into those power supply rails V+,GND, i.e. there is useful power conservation.

It should be appreciated that implementation could be by other than CMOS, e.g. by using N-channel pull-ups, P-channel pull-downs, bipolar transistors, negative resistance devices such as Gunn diodes, Mesfet, etc.

Regarding the transmission-lines 15 as such, a suitable medium readily applicable to ICs and PCBs and interconnects generally is as commonly referred to as microstrip or coplanar waveguide or stripline, and well known to be formable lithographically, i.e. by patterning of resists and etching. Practical dielectrics for an on-IC transmission-line include silicon dioxide ($SiO_2$) often referred to as field oxide, inter-metal dielectrics, and substrate dielectrics (which can be used at least for semi-insulating structures, e.g. of silicon-on-insulator type).

Figure 9:
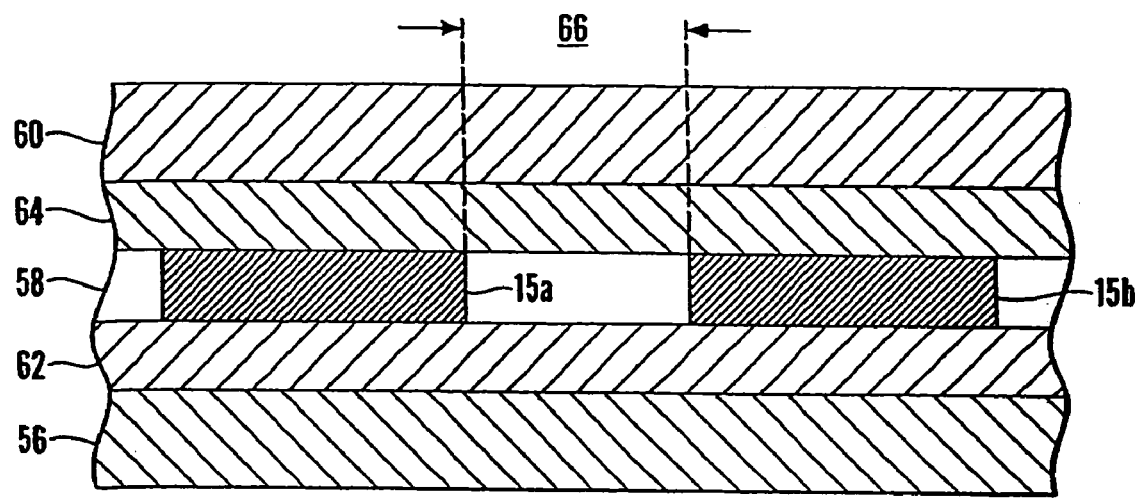
FIG. 9 is a cross sectional view of part of a transmission-line on an IC.

FIG. 9 is a cross-section through a portion of one exemplary on-IC transmission-line formation comprising three metal layers 56, 58 and 60 and two dielectric layers 62 and 64. Middle metal layer 58 is illustrated as comprising the two transmission-line loop conductive traces 15a and 15b that are at least nominally parallel. Upper metal layer 60 could be used as an AC 'ground' plane and could be connected to the positive supply voltage V+, lower metal 56 being a 'ground' plane that could be connected to the negative supply voltage GND. The dielectric layers 62 and 64 between the metal transmission-line traces at 58 and 'ground' planes 56 and 58 are typically formed using silicon dioxide ($SiO2$). The full illustrated structure is seen as preferable, though maybe not essential in practice, i.e. as to inclusion of either or both of the 'ground' planes and the dielectric layers 62, 64. The physical spacing 66 between the conductive traces 15a, 15b affects the differential and common modes of signal propagation, which should preferably have equal, or substantially equal, velocities in order to achieve minimum dispersion of the electromagnetic field from the spacing 66. Screening properties improve with use of 'ground planes', as does the ability for the structure to drive non-symmetrical, i.e. unbalanced, loads applied to the conductive traces 15a, 15b.

Inter-metal dielectric layers on a typical IC CMOS process are thin, typically about 0.7 µm, so microstrip transmission-line features with low signal losses must have a low characteristic impedance Zo (as hitherto for un-terminated, partially terminated or series terminated lines acting to reduce signal reflections to a manageable level). Self-sustaining, non-terminated, closed-loop transmission-lines 15 hereof inherently have very low power consumption for maintained traveling EM wave oscillation as the dielectric and conductor losses to be overcome are typically low. From FIG. 5b, it will be appreciated that, if there were no resistive losses associated with the transmission-line 15 and amplifiers 21, the transmission-line 15 would require no more energy than required initially to 'charge-up' the transmission-lines inductive Le and capacitive Ce elements. The EM wave would continually travel around the transmission-line with all energy in the transmission-line 15 simply transferred, or recycled between its electric and magnetic fields, thus capacitive Ce and inductive Le elements. Whilst there must be some resistive losses associated with the transmission-line 15 and amplifiers 21, see transmission-line resistive elements $R_0$-$R_2$ in FIG. 5a, the resistance is typically low and associated resistive losses will be also low. There is no penalty herein from for using low-impedance transmission-lines 15, even advantage from being less affected by capacitive loading, thus resulting in 'stiffer' drive to logic gates.

A crossover 19 can be implemented on an IC using 'vias' between the metal layers, preferably with each via only a small fraction of total length S of the transmission-line 15.

Figure 10A:
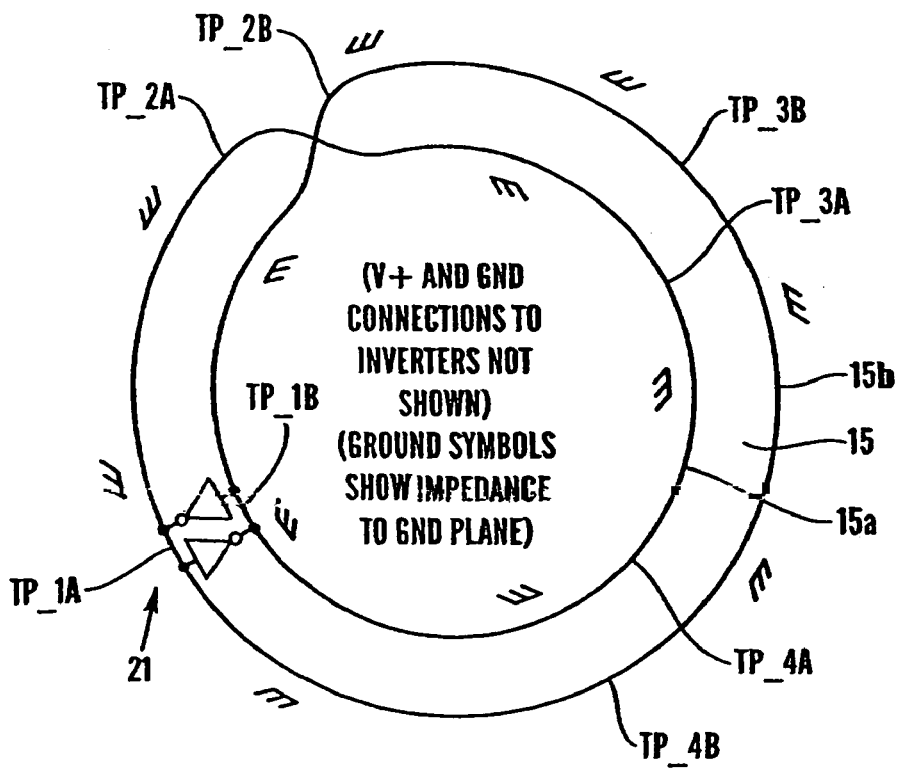
FIGS. 10a and 10b are outline circuit and idealized graphs for a standing wave version.
Figure 10B:
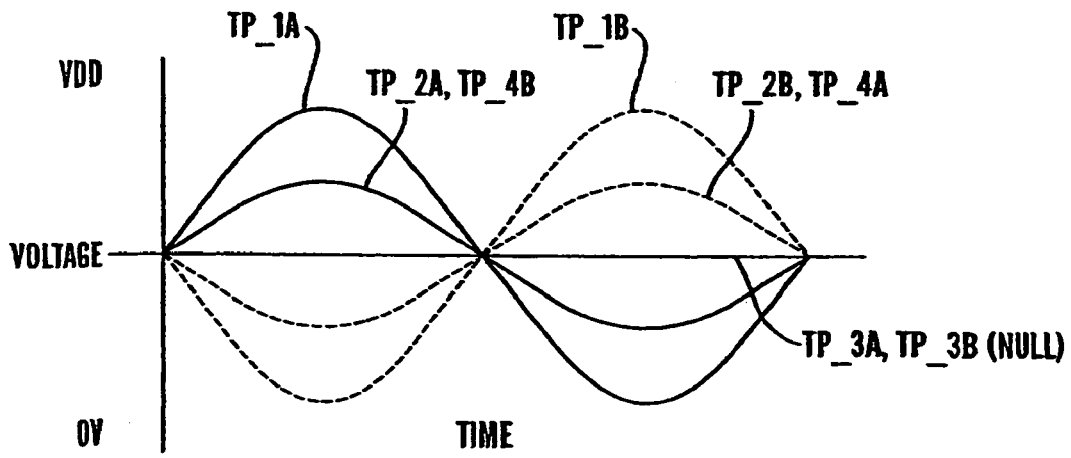

A variant is available where a transmission-line 15 hereof has only one amplifier 21 connected to the transmission-line, and the EM wave no longer travels around the transmission-line 15 so that a standing wave oscillation results, see FIG. 10a for single amplifier 21 and FIG. 10b for differential waveforms. Such amplifier should not extend over more than approximately 50 of the electrical length of the transmission-line 15. If the single amplifier 21 never goes fully 'on' or 'off' a standing sine wave oscillation will result in the transmission-line 15, which will have varying amplitude with the same phases at the same positions including two stationary, two 'null regions.

It follows that traveling wave operation will be available using a few spaced or just one lengthy CMOS bidirectional inverter formation, though plural small inverters will produce smoother faster results. Offsetting formations of the amplifiers 21, even just its input/output terminals, can predispose a traveling EM wave to one direction of transmission-line traversal, as could specific starter circuit such as based on forcing first and slightly later second pulses onto the transmission-line at different positions, or incorporation of some known microwave directional coupler.

Figure 11:
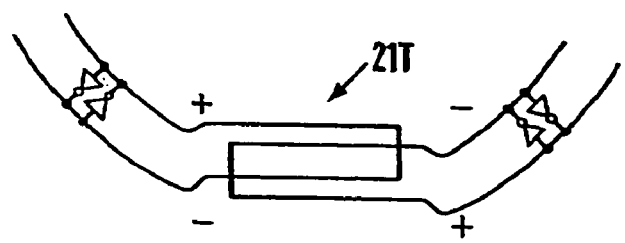
FIG. 11 is a scrap outline of a transmission-line with inverting transformer.

Inverting transmission-line transformers can be used instead of the crossovers (19) and still yield a transmission line having endless electromagnetic continuity, see FIG. 11 for scrap detail at 21T.

Figure 12:
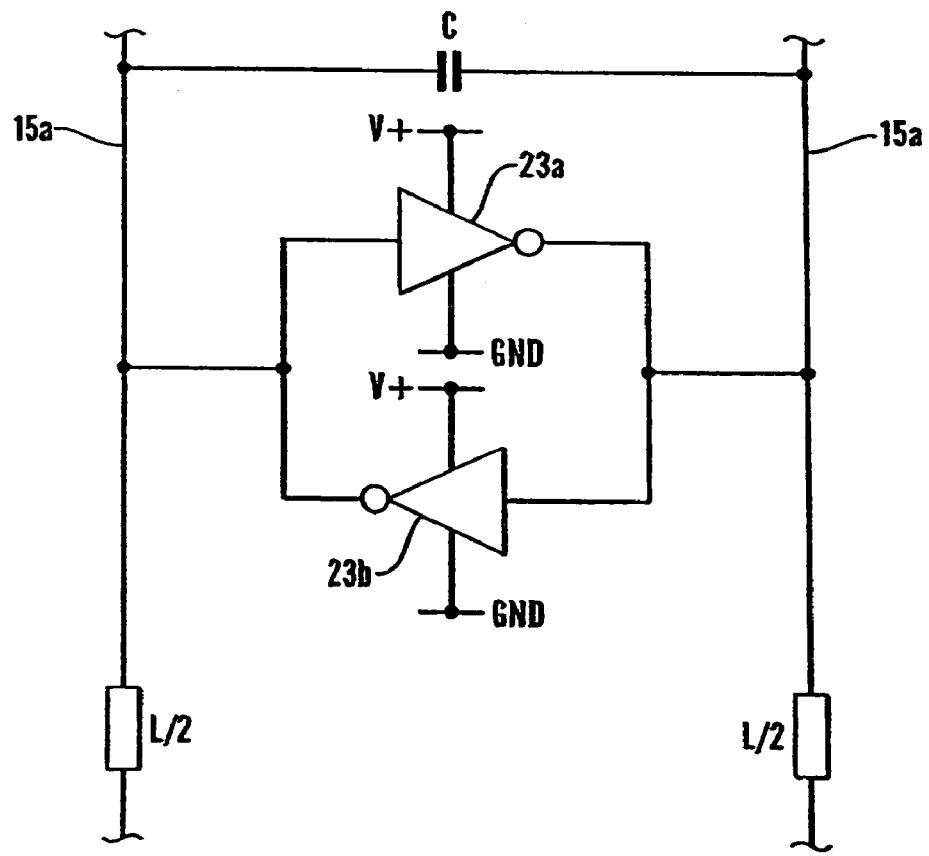
FIG. 12 shows a pair of back-to-back inverters connected across part of a transmission-line.
Figure 13A:
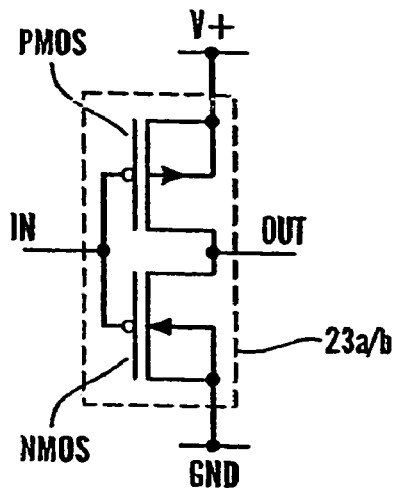
FIGS. 13a and 13b are outline and equivalent circuit diagrams of CMOS back-to-back inverters.

FIG. 12 shows a pair of back-to-back inverters 23a, 23b with supply line connectors and indications of distributed inductive (L/2) and capacitive (C) elements of a transmission-line as per FIG. 5b. FIG. 13a shows N-channel and P-channel Mosfet implementation of the back-to-back inverters 14a and 14b, see out of NMOS and PMOS transistors.

Figure 13B:
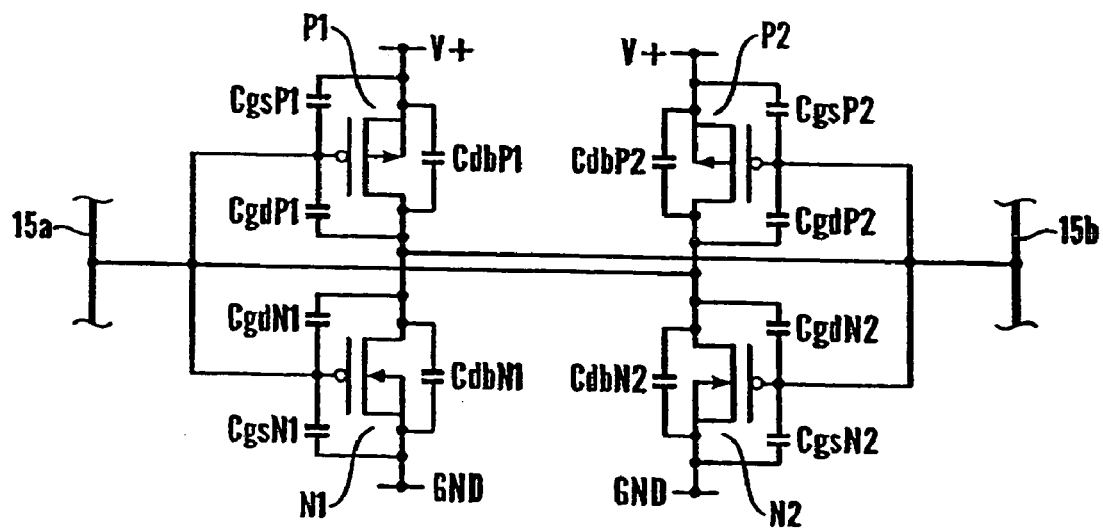

FIG. 13b shows an equivalent circuit diagram for NMOS (N1, N2) and PMOS (P1, P2) transistors, together with their parasitic capacitances. The gate terminals of transistors P1 and N1 are connected to the conductive trace 15a and to the drain terminals of transistors P2 and N2. Similarly, the gate terminals of transistors P2 and N2 are connected to the conductive trace 15b and to the drain terminals of transistors P2 and N2. The PMOS gate-source capacitances CgsP1 and CgsP2, the PMOS gate-drain capacitances CgdP1 and CgdP2, and the PMOS drain-source and substrate capacitances CdbP1 and CdbP2, also the NMOS gate-source capacitances CgsN1 and CgsN2, the NMOS gate-drain capacitances CgdN1 and CgdN2, and the NMOS drain-source and substrate capacitances CdbN1 and CdbN2 are effectively absorbed into the characteristic impedance Zo of the transmission-line, so have much less effect upon transit times of the individual NMOS and PMOS transistors. The rise and fall times of the waveforms .PHI.1 and .PHI.2 are thus much faster than for prior circuits.

Figure 14A:
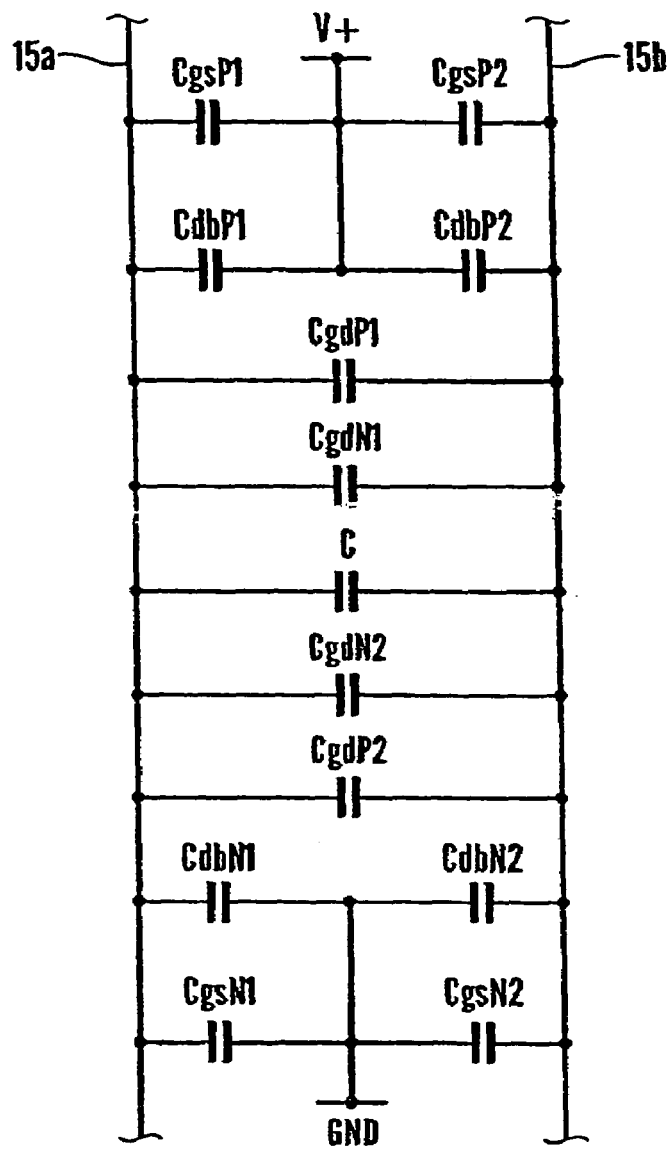
FIG. 14a details capacitive elements of a transmission-line together with CMOS transistors.
Figure 14B:
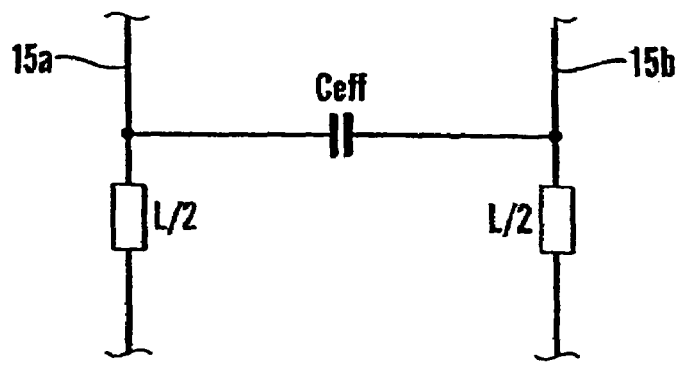

For clarity FIGS. 12–14 omit related resistive (R) elements. FIG. 14a shows only the capacitive elements (as per FIGS. 12 and 13b) of the transmission-line 15 together with those of the N/PMOS transistors. FIG. 14b illustrates another equivalent circuit diagram for FIG. 14a including the transmission-line distributed inductive (L/2) elements and the effective capacitance Ceff given by:

$$Ceff = C + CgdN + CgdP + [(CgsN + CdbN + CgsP + CdbP)/4];$$

Where:

$CgdN = CgdN1 + CgdN2$;

$CgdP = CgdP1 + CgdP2$;

$CgsN = CgsN1 + CgsN2$;

$CdbN = CdbN1 + CdbN2$;

$CgsP = CgsP1 + CgsP2$; and $CdbP = CdbP1 + CdbP2$.

Capacitance loading due to gate, drain, source and substrate junction capacitances are preferably distributed as mentioned previously.

An advantage of having a differential- and common-mode, transmission-line, is that 'parasitic' capacitances inherent within mosfet transistors can be absorbed into the transmission-line impedance Zo, as illustrated in FIGS. 14a and 14b, and can therefore be used for energy transfer and storage. The gate-source capacitances (Cgs) of the NMOS and PMOS transistors appear between the signal conductor traces 15a, 15b and their respective supply voltage rails and can be compensated for by removing the appropriate amount of respective capacitance from connections of the transmission-line 15 to the supply voltage rails, say by thinning the conductor traces 15a, 15b by an appropriate amount. The gate-drain capacitance (Cgd) of the NMOS and PMOS transistors appear between the conductive traces 15a and 15b and can be compensated for by proportionally increasing the spacing 66 between the conductive traces 15a, 15b at connections to the NMOS and PMOS transistors of the inverters 23a/b.

By way of a non-restrictive example, on a 0.35 micron CMOS process, a usable 5 GHz non-overlapping clock signal should result with transmission-line loop length (S/2) of 9 mm for a phase velocity of 30% of speed-of-light, as determined by capacitive shunt loading distribution and dielectric constants, the total length (S), of the conductor 17 thus being 18 mm.

The substrate junction capacitances (Cdb) of the NMOS and PMOS transistor could be dramatically reduced by using semi-insulating or silicon-on-insulator type process technologies.

There is a continuous DC path that directly connects the terminals of each of the amplifiers 21, i.e. the respective input/output terminals of each and all of the inverters 23a, 23b, but this path is characterized by having no stable DC operating point. This DC instability is advantageous in relation to the regenerative action of each of the respective amplifiers 21.sub.1–21.sub.4 and their positive feedback action.

Transmission-lines 15 hereof can be routed around functional logic blocks as closed-loops that are 'tapped into' to get 'local' clock signals. CMOS inverters can be used as 'tap amplifiers' in a capacitive 'stub' to the transmission-line 15, which can be 'resonated out' by removing an equivalent amount of 'local' capacitance from the transmission-lines, say by local thinning of conductor traces (15a/15b) as above.

Capacitive 'clock taps' can be spread substantially evenly along a transmission-line 15 hereof having due regard as a matter of design to their spacings, which, if less than the wavelength of the oscillating signal, will tend to slow the propagation of the EM wave and lower the characteristic impedance Zo of the transmission-line (15), but will still result in good signal transmission characteristics.

Figure 15:
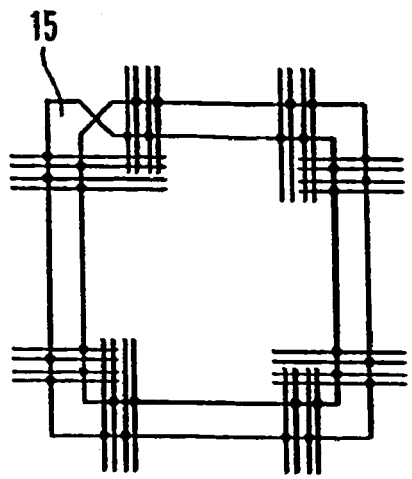
FIG. 15 shows capacitive stub connections to a transmission-line.

Within functional logic blocks that are small relative to clock signal wavelength, un-terminated interconnects work adequately for local clocking with phase coherence, see FIG. 15. For clarity, the pairs of connections to the transmission-line 15 are shown slightly offset, though they would typically be opposite each other in practice. Alternative tap-off provisions include light bidirectional of passive resistive, inductive or transmission-line nature, or unidirectional or inverting connections, including much as for what will now be described for interconnecting transmission-lines 15 themselves.

Plural oscillators and transmission-lines 15 can readily be operatively connected or coupled together in an also inventive manner, including synchronizing with each other both in terms of phase and frequency provided that any nominal frequency mismatch is not too great. Resistive, capacitive, inductive or correct length direct transmission-line connections/couplings, or any combinations thereof, can make good bidirectional signal interconnections. Signal connection or coupling between transmission-lines can also be achieved using known coupling techniques as used for microwave micro-strip circuits, generally involving sharing of magnetic and/or electrical flux between adjacent transmission lines. Unidirectional connections can also be advantageous. Connectors and couplings hereof are capable of maintaining synchronicity and coherency of plural transmission-line oscillators throughout a large system, whether within ICs or between IC's say on printed circuit boards (PCBs).

Connection/coupling of two or more transmission-lines and cross-connection rules are similar to Kirchoff's current law but based on the energy going into a junction, i.e. a connection or coupling, of any number of the transmission-lines being equal to the energy coming out of the same junction, i.e. there is no energy accumulation at the junction. When the supply voltage V+ is constant, the rule is, of course, precisely Kirchoff's current law. By way of a practical example, if there is a junction common to three transmission-lines, the simplest, but not the only, solution is that one of the transmission-lines has half the characteristic impedance of the other two transmission-lines. Where there are any even number of coupled transmission-lines, their respective characteristic impedances can all be equal. However, there are an infinite number of combinations of impedances which will satisfy Kirchoff's current law. The cross-connection rule, within a transmission-line, is the same as the rules for coupling two or more transmission-lines described above.

There will be high quality differential signal waveforms .PHI.1 and .PHI.2, in terms of phase and amplitude, at all points around a transmission-line network 15 when the following criteria are met:

(i) the transmission-lines have substantially matching electrical lengths (ii) above Kirchoff-like power rules are satisfied (iii) there is phase inversion.

There are, of course, an infinite number of coupled network designs and supply voltages that will fulfill the above three criteria, such as for example: short sections of slow, low impedance transmission-lines that are coupled to long fast, high impedance transmission-lines; and one- and/or three-dimensional structures etc. However, for the best wave-shapes and lowest parasitic power losses, the phase velocities of the common-mode and the differential-mode, i.e. even and odd modes, should be substantially the same. The same, or substantially the same, phase velocities can be designed into a system by varying the capacitances of the transmission-lines.

The supply voltage V+ does not have to be constant throughout a system, provided that above Kirchoff-like power/impedance relationships are maintained and result in an inherent voltage transformation system that, when combined with the inherent synchronous rectification of the inverters 23a and 23b, allows different parts of the system to operate at different supply voltages, and power to be passed bi-directionally between such different parts of the system.

Figure 16:
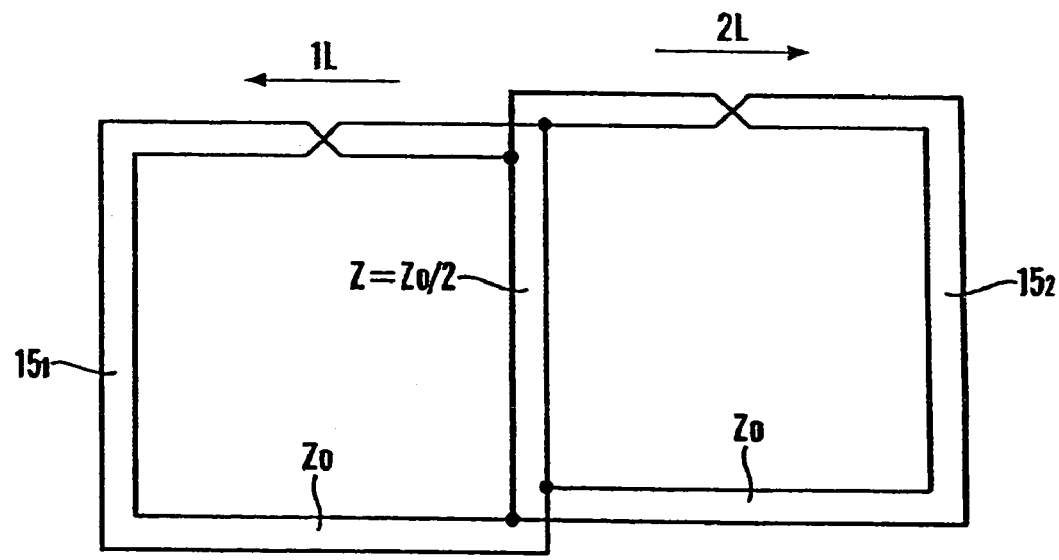
FIG. 16 shows one connection for self-synchronizing transmission-line oscillators.

FIG. 16 shows two substantially identical transmission-line oscillators hereof that are operatively connected such that they are substantially self-synchronizing with respect to frequency and phase. The transmission-lines 15.sub.1 and 15.sub.2 are shown 'siamesed' with the common part of their loop conductive traces meeting above Kirchoff-like power/impedance rule by reason of its impedance being half the impedances (20) of the remainders of the transmission-lines 15.sub.1 and 15.sub.2, because the common parts carry rotating wave energy of both of the two transmission-lines 15.sub.1 and 15.sub.2. As noted above, the originating trace length S of a transmission-line is one factor in determining the frequency of oscillation so transmission-lines 15.sub.1 and 15.sub.2 using the same medium and of substantially identical length S will have substantially the same frequency of oscillation F and will be substantially phase coherent. In FIG. 16, respective EM waves will travel and re-circulate in opposite directions around the transmission-lines 15.sub.1 and 15.sub.2, see marked arrows 1L, 2L (or both opposite), in a manner analogous to cog wheels. Such siamesing connection of transmission-lines can readily be extended sequentially to any number of such 'cogged' transmission-line oscillators.

Figure 17A:
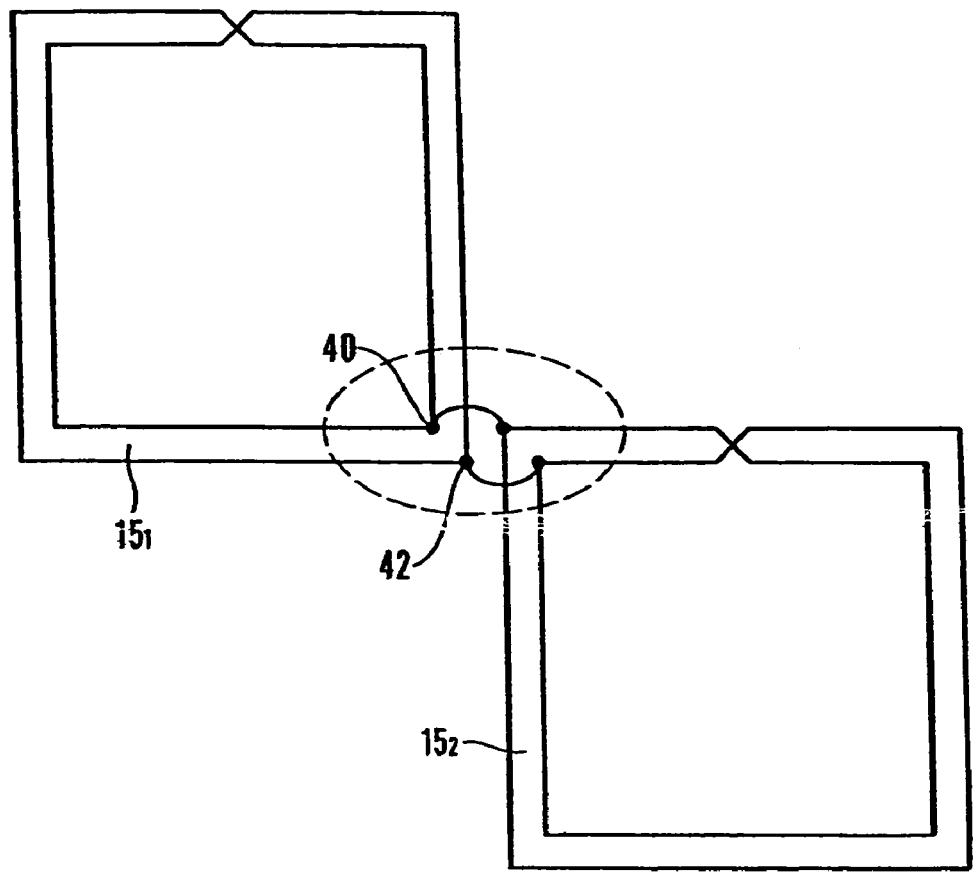
FIGS. 17a–17c show other connections for self-synchronizing transmission-line oscillators.
Figure 17B:
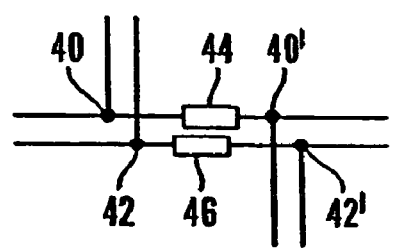
Figure 17C:
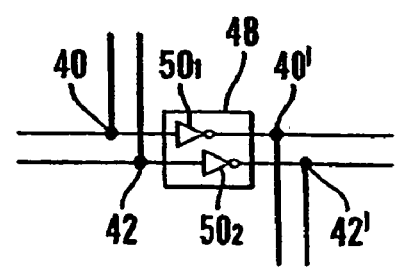
Figure 18:
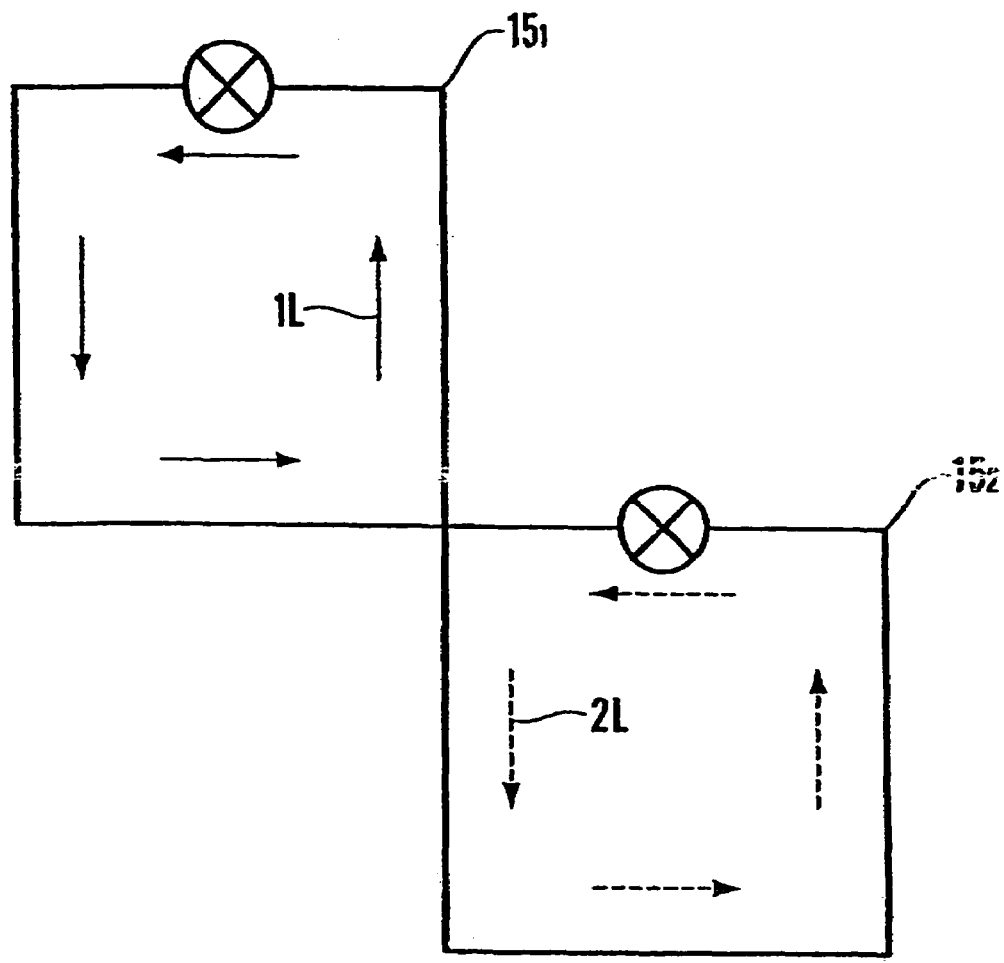

FIG. 17a shows another example of two substantially identical transmission-line oscillators with their transmission lines 15, and 152 operatively connected to be substantially self-synchronizing in frequency and phase by direct connections at two discrete positions 40 and 42. FIG. 17b shows such direct connections via passive elements 44, 46 that could be resistive, capacitive or inductive or any viable combination thereof. FIG. 17c shows such direct connections via unidirectional means 48 that can be two inverters 50.sub.1 and 50.sub.2. The unidirectional means 48 ensures that there is no coupling or signal reflection from one of the transmission-lines (15.sub.2) back into the other (15.sub.1), i.e. only the other way about. Directions of travel of re-circulating EM waves are again indicated by arrows 1L, 2L that are solid but arbitrary for transmission-line oscillator 15.sub.1 and dashed for 15.sub.2 in accordance with expectations as to a 'parallel'-coupled pair of transmission-lines yielding contra-directional traveling waves. FIG. 18 is a convenient simplified representation of the two self-synchronized transmission-line oscillators of FIG. 17a, and similar representations will be used in following Figures.

Figure 19A:
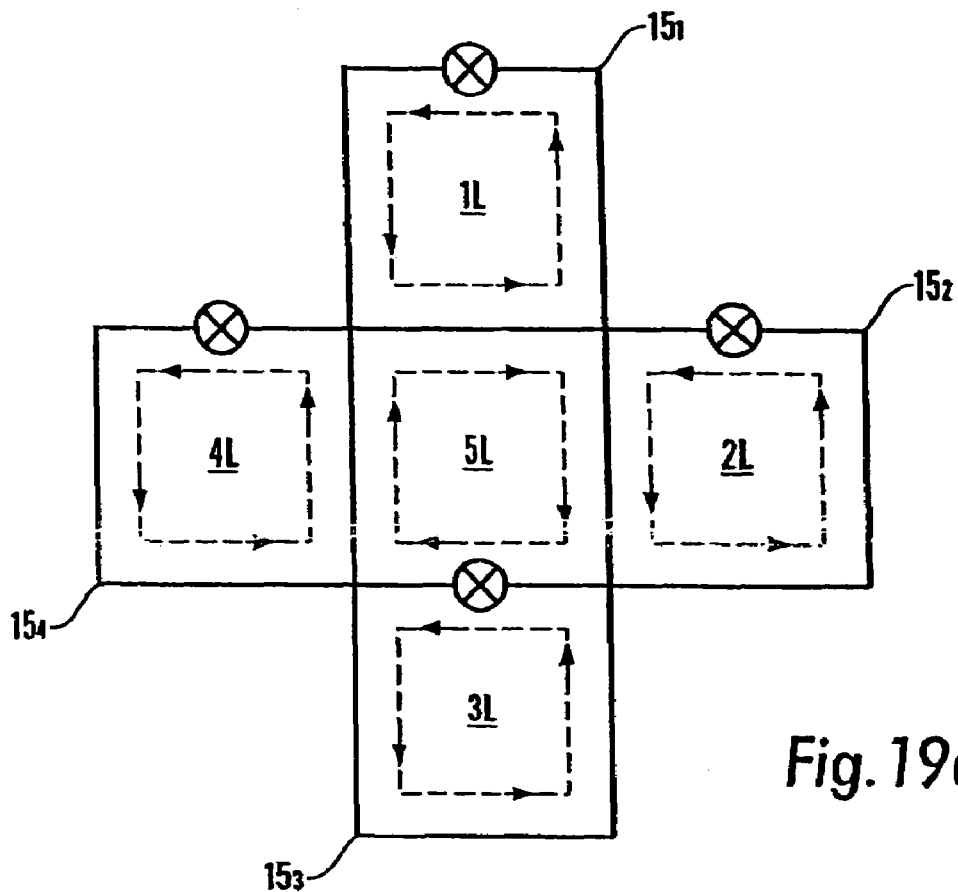
FIGS. 19a and 19b show connection of four transmission-line oscillators.

FIG. 19a shows four self-synchronized transmission-line oscillators 15.sub.1–15.sub.4 connected together basically as for FIGS. 17a-17c, but so as further to afford a central fifth effective transmission-line timing signal source of this invention affording a re-circulatory traveling EM wave according to indicated EM wave lapping directions 1L–4L of the four transmission-line oscillators 15.sub.1–15.sub.4. As shown the central fifth transmission-line oscillator physically comprises parts of each of the other four, and has a lapping direction 5L that is opposite to theirs, specifically clockwise for counter-clockwise 1L–4L. It will be appreciated that this way of connecting transmission-line oscillators together can also be extended to any desired number and any desired variety of overall pattern to cover any desired area.

Figure 19B:
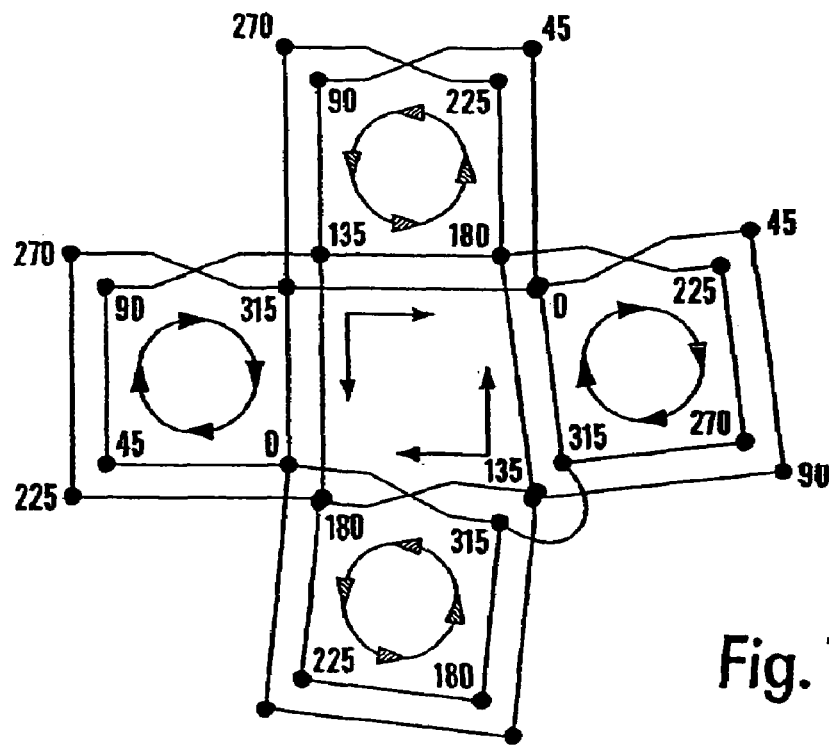

An alternative is shown in FIG. 19b where the central fifth transmission-line oscillator is not of re-circulating type, but is nonetheless useful and could be advantageous as to access to desired phases of timing signals.

Figure 20:
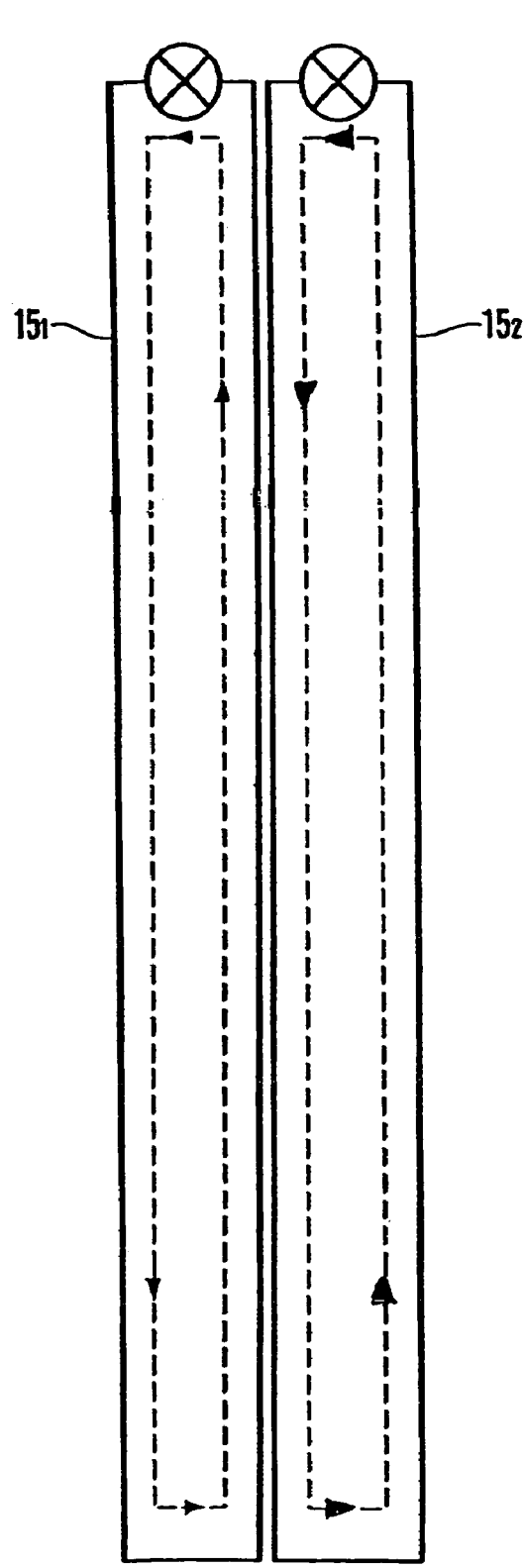
FIGS. 20 and 21 show magnetically coupled self-synchronized transmission-line oscillators.
Figure 21:
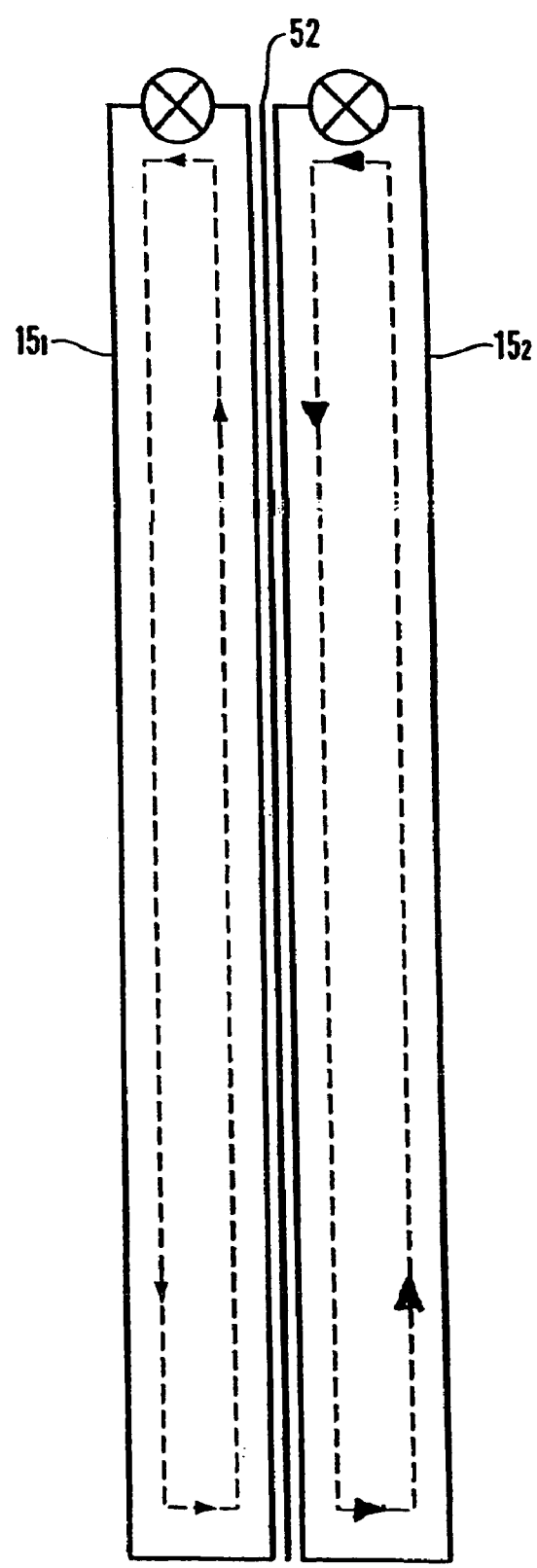

FIG. 20 shows two self-synchronizing oscillators with their transmission-lines 15.sub.1 and 15.sub.2 not physically connected together, rather operatively coupled magnetically; for which purpose it can be advantageous to use elongated transmission-lines to achieve more and better magnetic coupling. FIG. 21 shows another example of magnetically coupled self-synchronizing oscillators with transmission-lines 15.sub.1 and 15.sub.2 generally as for FIG. 20, but with a coupling enhancing ferromagnetic strip 52 operatively placed between adjacent parts to be magnetically coupled.

Figure 22:
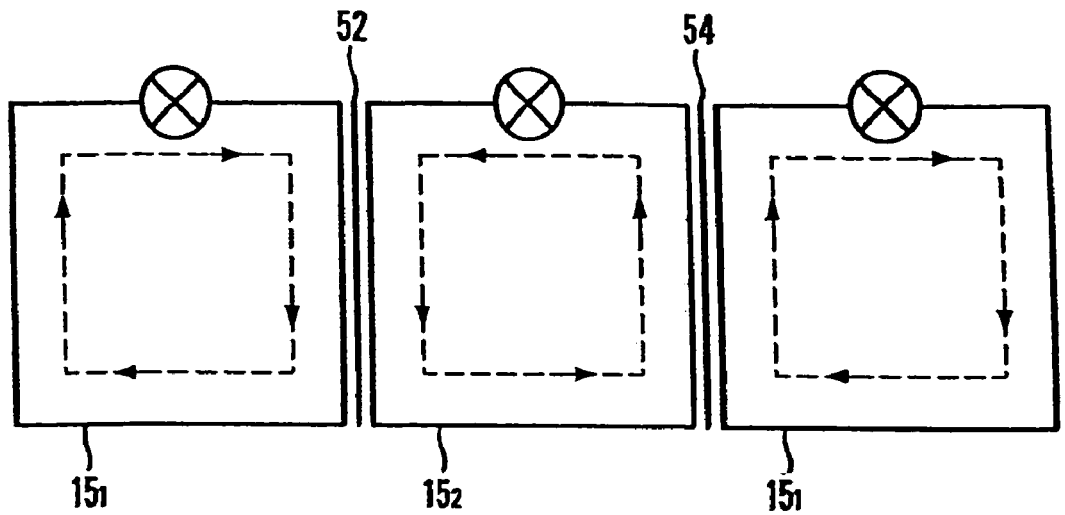
FIG. 22 shows three magnetically couple self-synchronized transmission-line oscillators.

FIG. 22 shows three self-synchronizing oscillators with their transmission-lines 15.sub.1, 15.sub.2 and 15.sub.3 magnetically coupled by a first ferrous strip 52 placed between transmission-lines 15.sub.1 and 15.sub.2 and a second ferrous strip 54 placed between transmission-lines 15.sub.2 and 15.sub.3. As a source of oscillating signals, the transmission-line 15.sub.2 does not need any regenerative provisions 21 so long as enough energy for oscillation is magnetically coupled from the other transmission-lines 15.sub.1 and 15.sub.3 that are complete with provisions 21. It is considered practical for the transmission-line 15.sub.2 to be longer and circumscribe a larger area but not to need or have regenerative provisions 21, nor a cross-over 19; and is then preferably an odd multiple (3 S, 5 S, 7 S etc) of the length (S) or at least the electrical length of at least one of the transmission-lines 15.sub.1 and 15.sub.3. This, of course, has further implications for self-synchronizing frequency- and phase-locking of oscillators (say as using transmission-lines 15.sub.1 and 15.sub.3), at a considerable spacing apart.

Further alternatives include use of a dielectric material (not illustrated) that spans over and/or under the portions of the conductive traces to be electromagnetically coupled.

Figure 23:
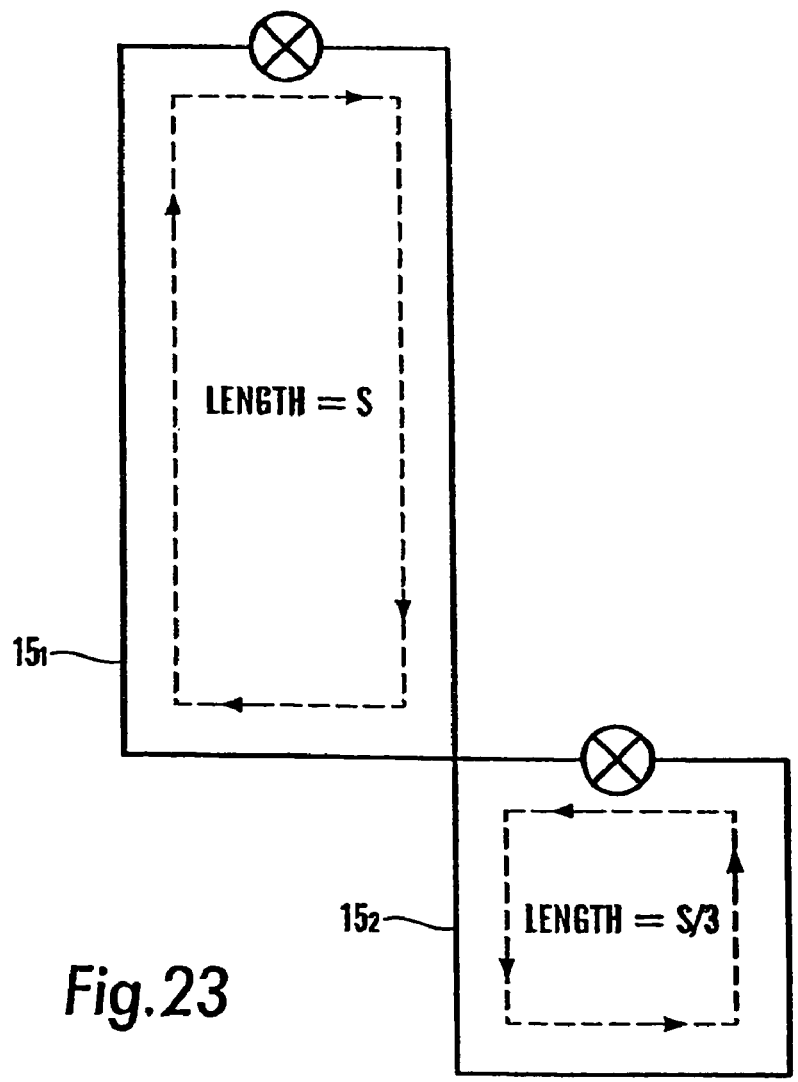
FIG. 23 shows connection of self-synchronizing transmission-lines oscillators of different frequencies.

It is feasible and practical to synchronize transmission-line oscillators operating at different frequencies. In FIG. 23, transmission-lines of two self-synchronizing oscillators are of different electrical lengths. Specifically, using same transmission-line structure/materials, first transmission-line 15, has a total conductive length S for a fundamental oscillating frequency F=F1 and is operatively connected and synchronized to a second transmission-line 15.sub.2 having a total conductive length that is one third of that of the first transmission-line 15.sub.1, i.e. S/3, thus an oscillating frequency of 3 F. The dashed lines with arrows indicate the direction of rotation of the EM waves. Operative connection is as for FIGS. 17a–c, though any other technique could be used. Self-synchronizing is due to above-mentioned presence in the highly square first transmission-line signal of a strong third harmonic (3 F). Similar results are available for higher odd harmonics, i.e. at frequencies of 5 F, 7 F etc.

Preferred coupling between transmission-lines of oscillators operating at such different odd harmonic related frequencies, is unidirectional so that the naturally lower frequency line (15.sub.1) is not encouraged to try to synchronize to the naturally higher frequency line (15.sub.2). Any number of transmission-line oscillators of different odd-harmonically related frequencies can be coupled together and synchronized as for FIG. 23.

Re-circulatory transmission-line oscillators hereof can be used in and for the generation and distribution of reference, i.e. clock, timing signal(s) in and of a semiconductor integrated circuit (IC); and is also applicable to a printed-circuit-board (PCB), e.g. as serving to mount and interconnect circuitry that may include plural ICs, or indeed, any other suitable apparatus/system where timing reference signal(s) is/are required.

For ICs as such, simulations using the industry standard SPICE techniques show potential for supplying clock signals of very high frequencies indeed, up to several tens of GHz, depending upon the IC manufacturing process employed and projections for their development. Generation and distribution can effectively be at, and service, all parts of an IC with predictable phases at and phase relationships between such parts, including as multiple clock signals that may have the same or different frequencies. Moreover, principles of operation of transmission-line oscillators hereof and their self-synchronizing inter-coupling extend or lead readily not only to reliable service of timing signals to operational circuitry within any particular IC and between ICs, but further and it is believed also importantly and inventively to data transfer between ICs etc.

The entire transmission-line 15 structure and network involving regenerative circuits 21 oscillates. The transmission-line 15 operates un-terminated, i.e. the transmission-line forms a closed-loop. The characteristic impedance Zo of the transmission-line is low and only 'top-up' energy is required to maintain oscillation.

Impedance between the two conductor traces 15a, 15b is preferably evenly distributed, thus well balanced, which helps achieve well defined, differential signal waveforms (.PHI.1, .PHI.2). Coherent oscillation occurs when the signals .PHI.1, .PHI.2 on the transmission-line 15 meet this 180.degree., or substantially a 180.degree., phase shift requirement for all inverting amplifiers 21 connected to the transmission-line 15 i.e. when all the amplifiers 21 operate in a coordinated manner with known phase relationship between all points along the transmission-line 15. Signal energy is transmitted into the transmission-line 15 both inductively and capacitively, i.e. magnetically and electrically, between the signal conductors 15a, 15b for the differential-mode, also between each signal conductor and the ground reference for the two individual common-mode (not present if the upper and lower 'ground' planes are absent, nor for connections via unshielded twisted-pair cables).

CMOS inverters as non-linear, operative switching and amplifying circuit elements have low losses from cross-conduction current as normally lossy transistor gate 'input' and drain 'output' capacitances are absorbed into the characteristic impedance Zo of the transmission-line 15, along with the transistor substrate capacitances, so power consumption is not subject to the usual ½.C.V.sup.2.f formula.

It is quite often assumed that the power dissipation due to capacitive charging and discharging of MOS transistor gates, for example, is unavoidable. However, the self sustaining oscillating nature of the transmission-line 15 is able to 'drive' the transistor gate terminals with low power loss. This is due to the fact that the required 'drive' energy is alternating between the electrostatic field, i.e. the capacitive field of the MOS gate capacitances, and the magnetic field, i.e. the inductive field elements of the transmission-line 15. Therefore, the energy contained within the transmission-line 15 is not being completely dissipated, it is in fact being recycled. Energy saving applies to all operatively connected transistor gates of the transmission-line 15.

It is envisaged that low loss efficiency of transmission-line oscillator hereof could well be used to 'clock' ICs for many previously popular logic systems that have since been overshadowed or abandoned as non-viable options for reasons attributed to problems associated with clock skew, clock distribution, power consumption etc. Non-exhaustive examples of such logic arrangements include poly-phase logic and charge recovery or adiabatic switching logic, such logic arrangements being known to those skilled in the art.

Figure 24:
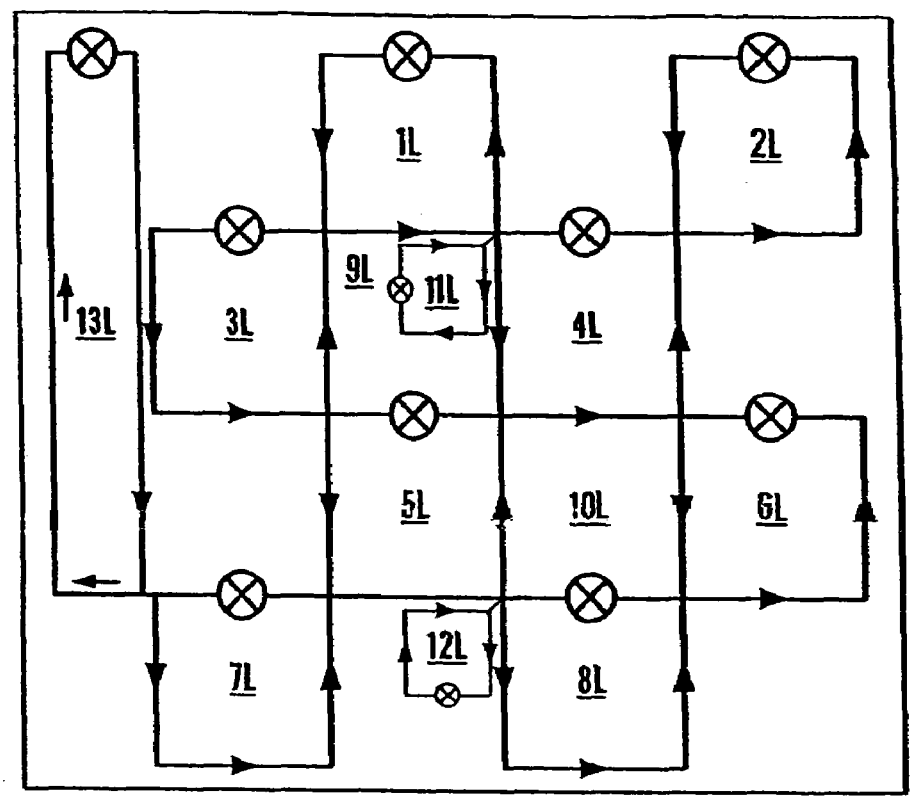
FIG. 24 shows an example of a clock distribution network for a monolithic IC.

FIG. 24 shows a possible clock distribution network hereof as applied to a monolithic IC 68 (not to scale, as is other Figures hereof). The IC 68 has a plural transmission-lines hereof shown as loops 1L–13L, of which loops 1L–10L and 13L all have the same effective lengths (say as for S above) and oscillate at a frequency F, and loops 11L and 12L each have shorter loop lengths (say as for S/3 above) and oscillate at a frequency 3 F. Loops 1L–8L and 11L–13L are full transmission-line oscillator complete with regenerative means, and loops 9L and 10L arise as parts of four of the former transmission-lines, namely 1L, 3L, 4L and 5L; 4L, 5L, 6L and 8L respectively.

The transmission-line (15) of the loop 13L is elongated with a long side close to the edge (i.e. scribe line) of the IC 68, so that it is possible to couple to another similarly set up separate monolithic IC for inter-coupling by such as flip-chip technology for frequency and phase locking by such as magnetic coupling, as described above. Phase and frequency locking of separate monolithic IC's can be very useful in such as hybrid systems.

Figure 25:
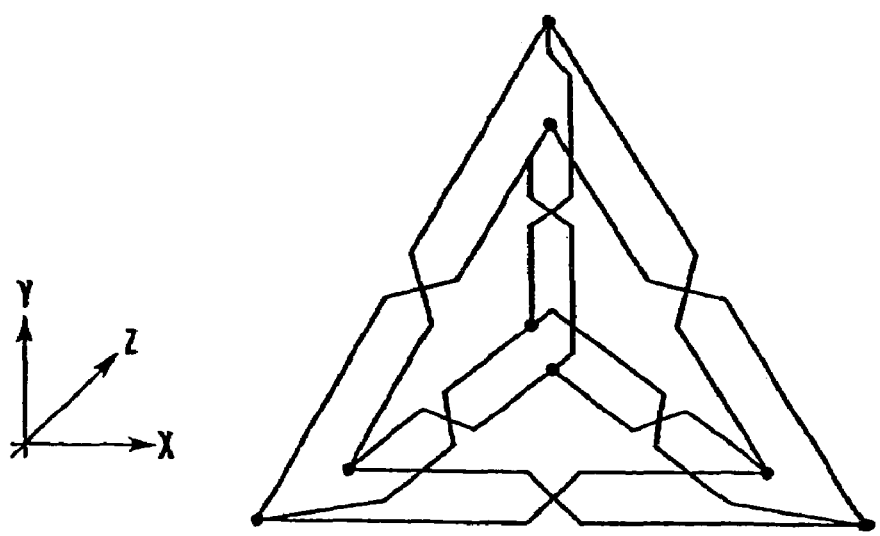
FIG. 25 shows 3D implementation for timing systems hereof.

FIG. 25 indicates feasibility of a three-dimensional network of interconnected transmission line oscillators hereof for signal distribution, specifically for a simple pyramidal arrangement, though any other structure could be serviced as desired, no matter how complex so long as interconnect rules hereof are met regarding electrical length, impedance matching, any phasing requirements for data transfer, etc.

ICs hereof can be designed to have whatever may be desired up to total frequency and phase locking, also phase coherence, including for and between two or more self-sustaining transmission-line oscillators greatly to facilitate synchronous control and operation of data processing activities at and between all the various logic and processing blocks associated with such IC.

Figure 26A:
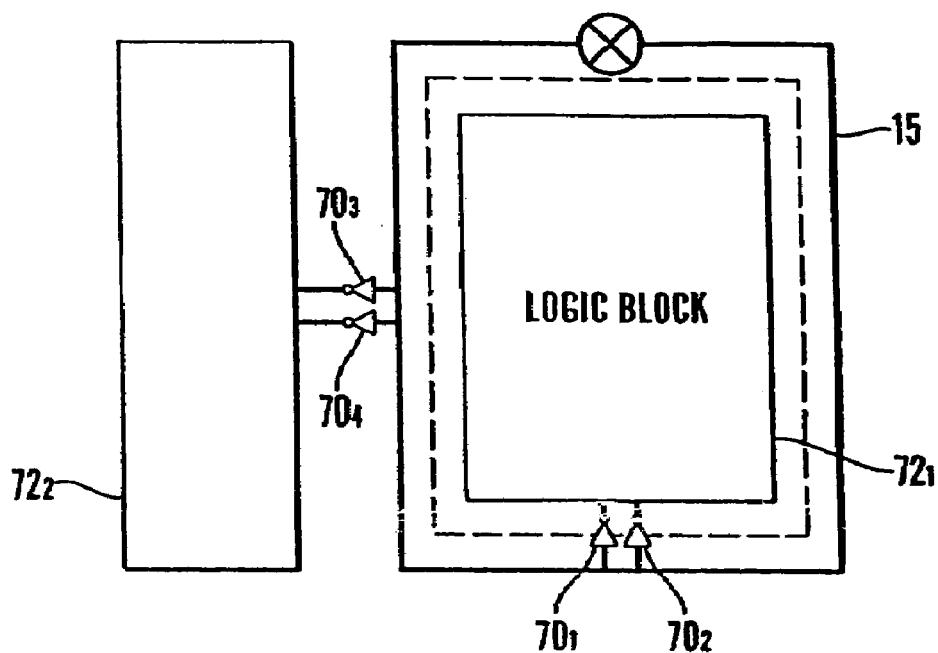
FIGS. 26a and 26b show examples of dual phase tap-off points.

FIG. 26a shows an example of dual phase tap-off using a pair of CMOS inverters 70.sub.1 and 70.sub.2 connected to the transmission-line conductive traces 15a and 15b respectively to provide local clock to and/or to be distributed about a logic block 72.sub.1. Whilst the logic block 72.sub.1 is shown as being 'enclosed' within the transmission-line 15 alternatives include it being outside any area enclosed by the transmission-line 15, as for the logic block 72.sub.2 and its associated inverters 70.sub.3, 70.sub.4, and/or it spanning the conductive traces 15a, 15b of the transmission line 15. If desired, say for large logic blocks 72.sub.1 and/or 72.sub.2 plural pairs of inverters 70 can 'tap' into the transmission-line 15, including for any desired phasing needed locally in the logic block 72, see dashed line. Capability accurately to select the phase of the oscillating clock signals .PHI.1, .PHI.2 allows complex pipeline logic and poly-phase logic (see FIG. 29 below) to be operatively designed and controlled.

Figure 26B:
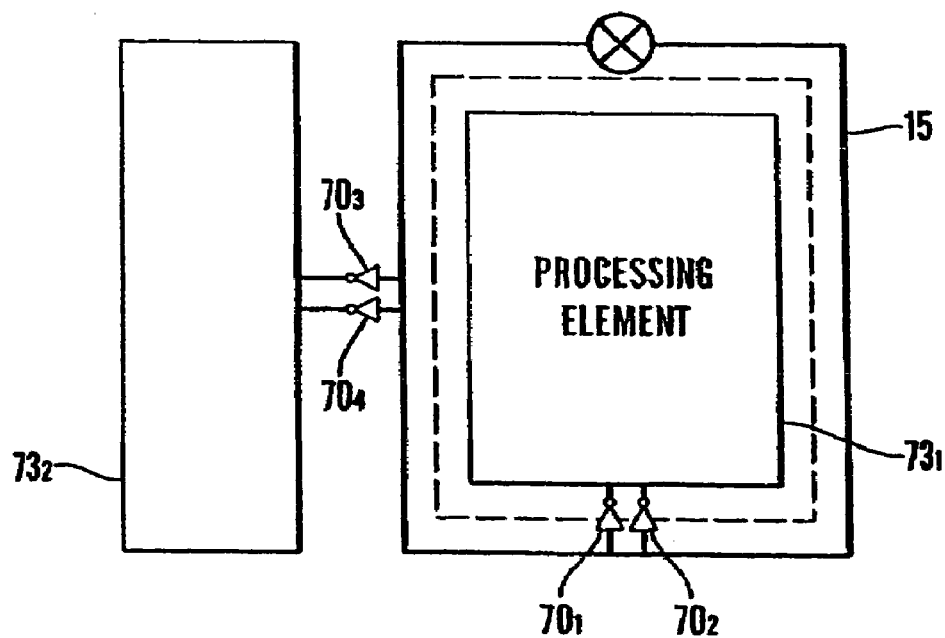
Figure 27:
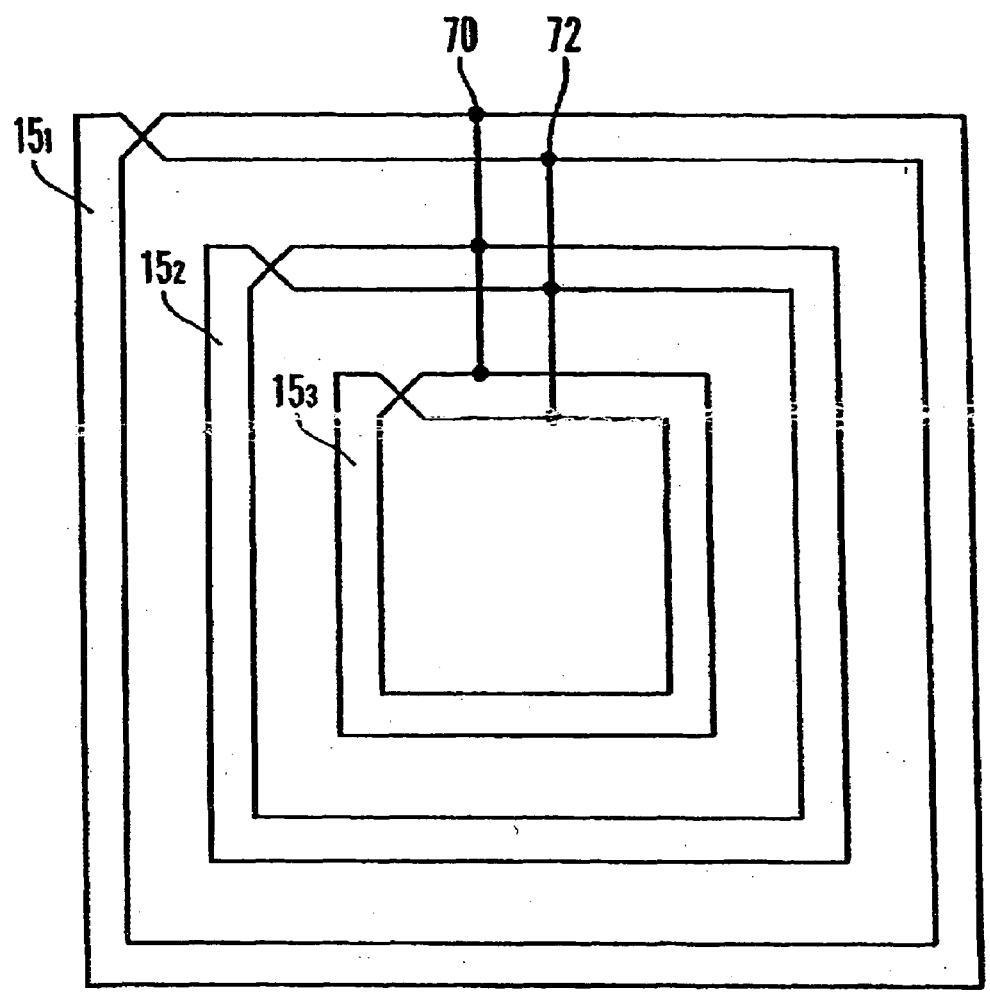
FIG. 27 shows three concentrically arranged transmission-line oscillators.

FIG. 26b differs in that the logic blocks 71.sub.1, 72.sub.2 are replaced by respective processing elements 73.sub.1, 73.sub.2, though there could be more, and for which one or more transmission-lines can be used to clock one or more of the processing elements. Two or a greater plurality of processing elements can operate independently and/or together, i.e. in parallel to achieve very fast and powerful data processing ICs/systems.

FIG. 27a shows concentrically arranged transmission-lines 15.sub.1–15.sub.3 of progressively less physical lengths. However, each of the three transmission-lines 15.sub.1–-5.sub.3 can be made so that they all oscillate at the same frequency, whether as a matter of structure or by respective velocities of the EM waves rotating around each of the shorter transmission-lines 15.sub.2 and 15.sub.3 being suitably retarded by increasing their inductance and/or capacitance per unit length. Moreover, the transmission-lines 15.sub.1–15.sub.3 can optionally have one or more operative connections 70 and 72 that will serve to synchronize the three transmission-lines 15.sub.1–15.sub.3. The advantages, apart from synchronicity, of having these connections 70, 72 are that the transmission-lines 15.sub.1–15.sub.3 will or can (i) act as a single multi-filament transmission-line;
(ii) have smaller conductive traces (15a, 15b);
(iii) cover a larger clocking area;

(iv) produce lower skin effect losses; and (v) produce lower crosstalk and coupling.

Figure 28A:
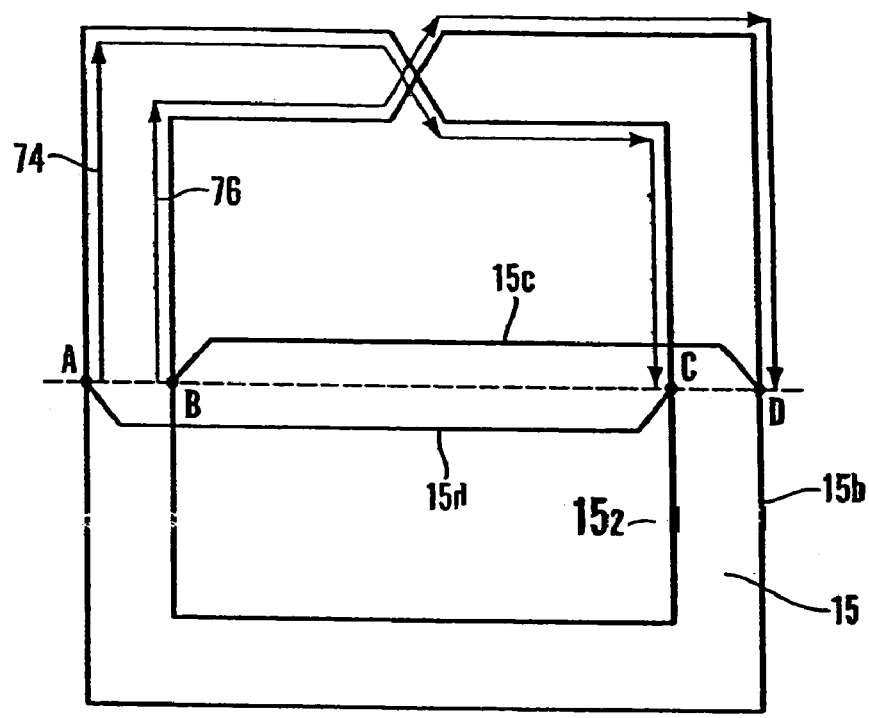
FIGS. 28a and 28b show a transmission-line having a cross-loop connection.
Figure 28B:
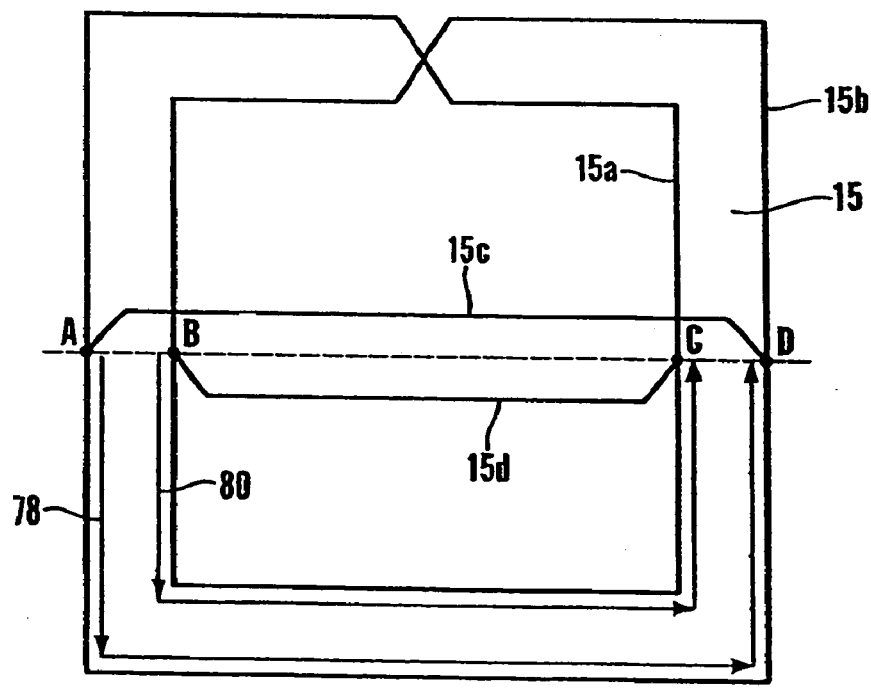

FIG. 28a shows a transmission-line having a cross-loop connection between positions A, B, C and D, which comprises further transmission-line 15c, 15d that has, in this particular example, an electrical length of 90.degree. to match spacing of the positions A, B and C, D. Other cross-connection electrical length could be chosen, then operatively connected at correspondingly different spacings of the positions A, B and C, D. Cross-loop connections allow further tap-off positions within area enclosed by the transmission-line 15. The transmission-line part 15d is shown connected in parallel, between points A and C, and part of the transmission-line 15 represented by line 74. Likewise, the transmission-line part 15c is shown connected in parallel, between points B and D, with part of the transmission-line 15 represented by line 76. The transmission-line parts 15c, 15d, 74 and 76 will be satisfactory if they each have an impedance that is half that associated with the remainder of the transmission-line 15, as above. The transmission-lines 15 and 15c,d will have operatively connected amplifiers 21. FIG. 28b shows the cross-loop connection 15c,d and the positions A, B, C and D set up relative to parts 78 and 80 of the transmission-line 15, i.e. instead of parts 74 and 76, respectively; but with Kirchoff-type rules applying again to result in parts 15c, 15d, 78 and 80 each having an impedance of half that associated with the remainder of the transmission-line 15. Introduction of plural additional transmission-lines such as 15c,d across a transmission-line 15 is feasible as required.

Figure 29A:
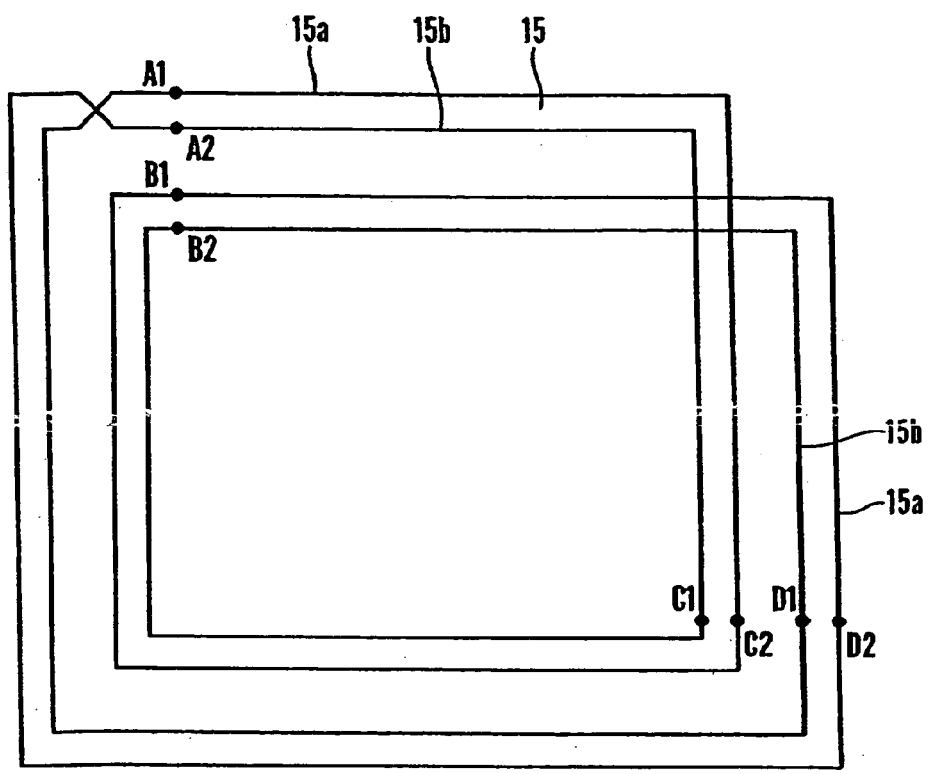
FIG. 29a shows a transmission-line configuration for four-phase signals.
Figure 29B:
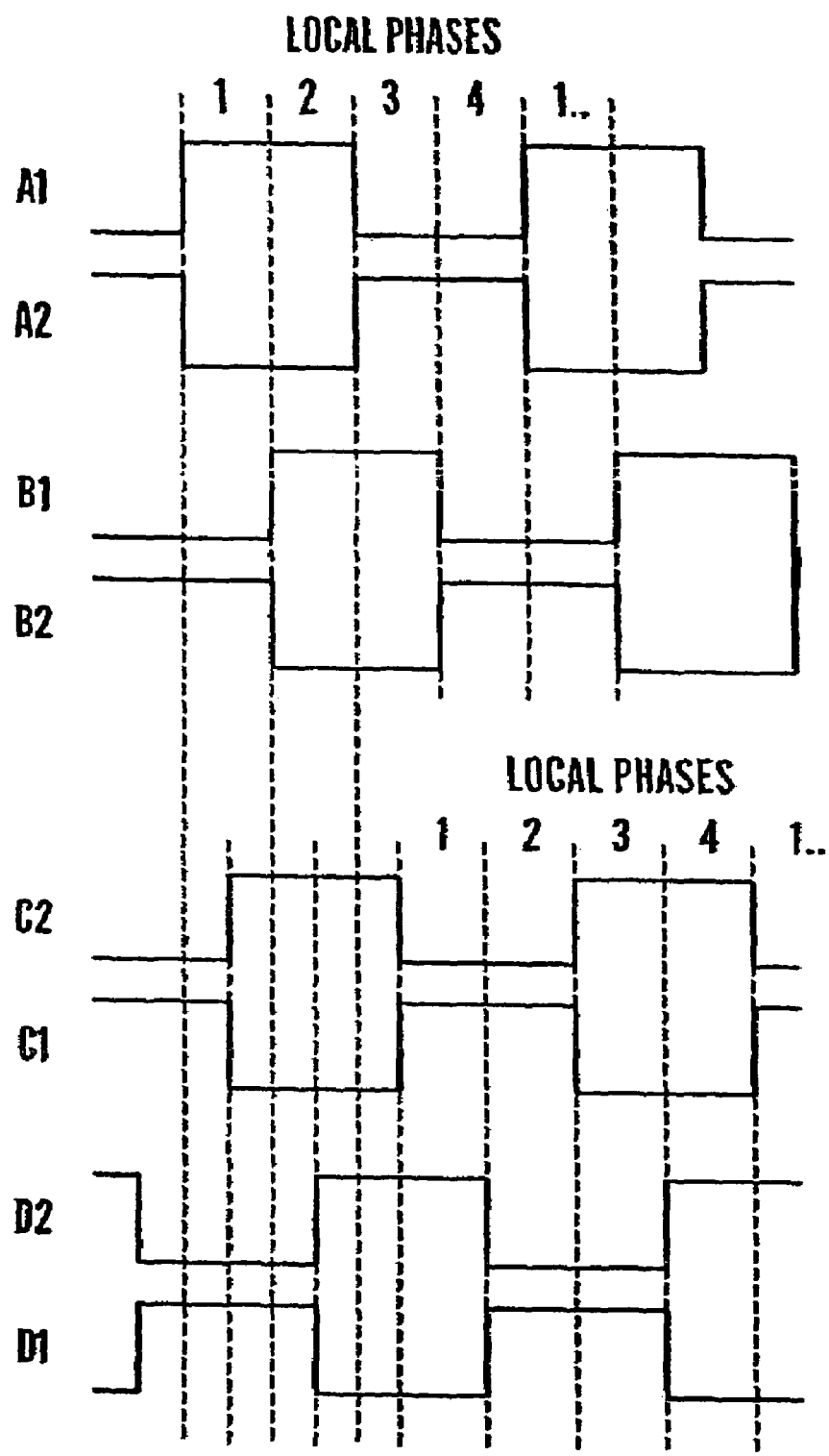
FIG. 29b shows idealized resulting four-phase signal waveforms.

FIG. 29a shows one way to produce four-phase clock signals. Effectively, a transmission-line 15 makes a double traverse of its signal carrying boundary, shown as rectangular, and further repeated traverses could produce yet more phases. In the example shown, the positions A1, A2, B1 and B2 will yield localized four-phase clock signals, as will the positions C1, C2, D1, and D2. The repeated boundary traverses will be with suitable mutual spacing/separation of the transmission-line 15 to avoid inter-coupling. FIG. 29b shows idealized four-phase signal waveforms at points A1, A2, B1 and B2 and at C1, C2, D1 and D2.

Figure 30:
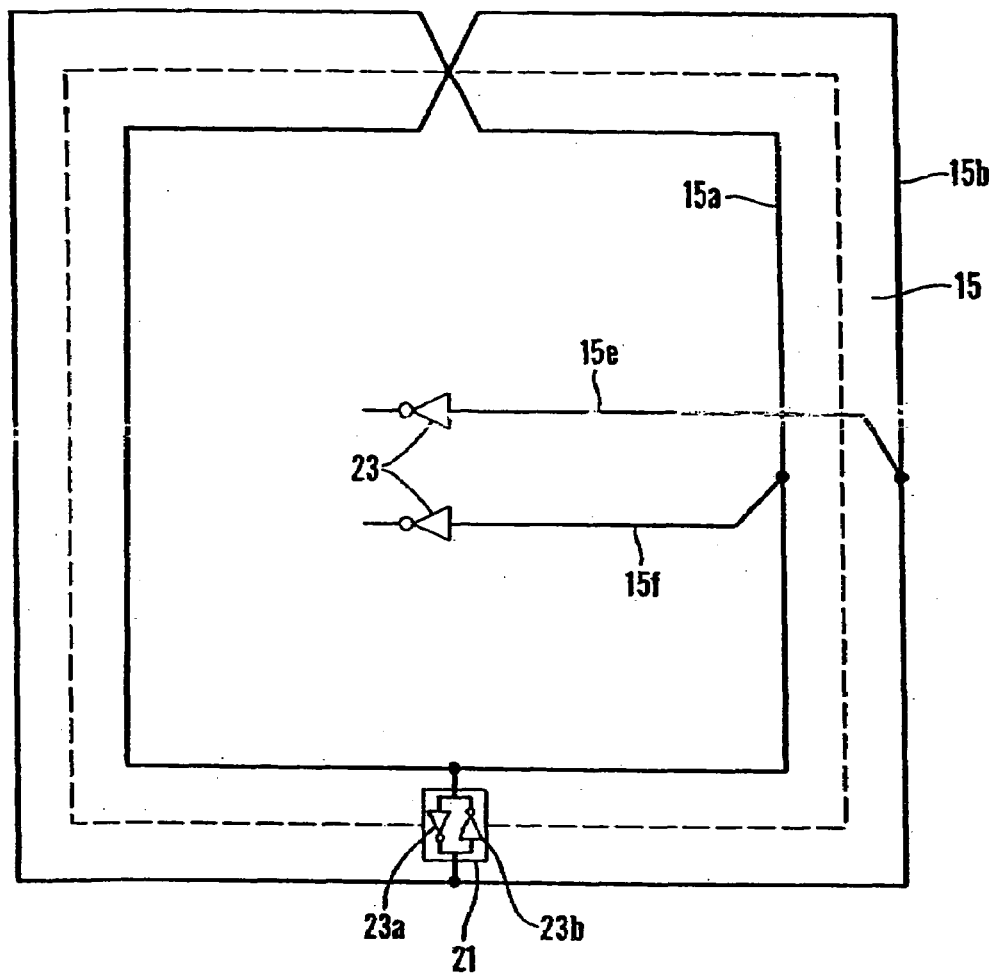
FIG. 30 shows an open-ended transmission-line connection.

FIG. 30 shows addition of an open-ended passive transmission-line (15e, 15f) connected to the closed-loop transmission-line 15 and having the characteristics, of having an electrical length of 180.degree., of producing no adverse effect at the tap point, since it acts as an open-circuit oscillating stub. Amplifiers 21 will not be present along this open-ended line 15e,f but inverters 23 could be far ends of each of the traces 15c and 15d to reduce risk of spurious oscillations. Indeed, tuned oscillation in such stubs 15e,f can have useful regenerative effects for the transmission-line 15 and thus serve for reinforcement and/or stability purposes.

Passive transmission-line connections with no particular requirement for impedance matching can be used to connect oscillating transmission-lines of the same, or substantially the same, frequency together, at least provided that enough interconnections are established between two systems, at connection positions with the same relative phases in the interconnected networks. Such connections can assist in synchronizing high speed digital signals between IC's and systems because non-clock signals (i.e. the IC/system data lines) will have similar delay characteristics if they are incorporated into the same routing (e.g. ribbon cable, twisted pair, transmission-line) as the clock connections, thus making data and clocking coherent between different systems.

Figure 31:
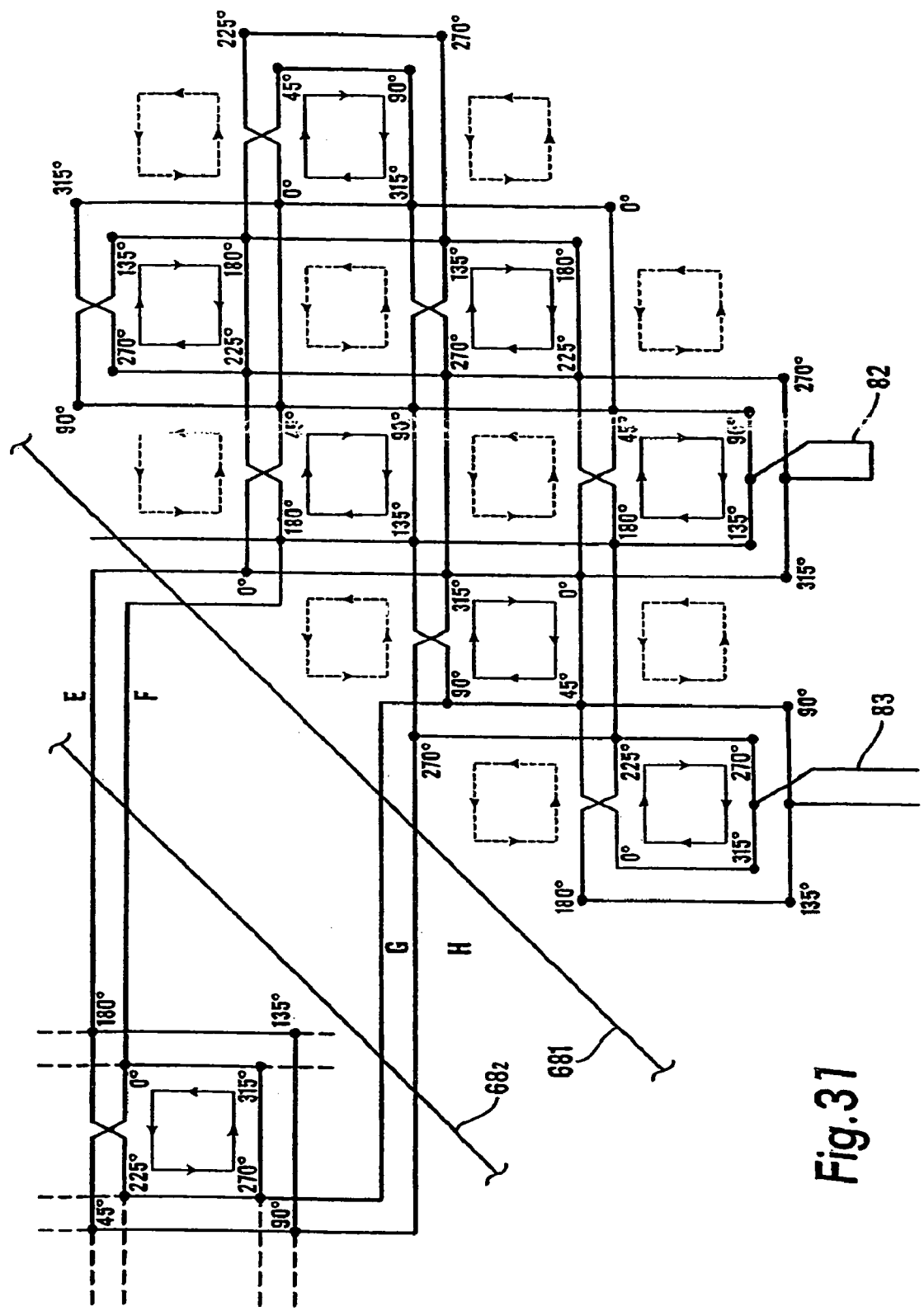
FIG. 31 concerns coordinating frequency and phase for two IC's.

FIG. 31 shows one example of coherent frequency and phase operation of two clock distribution networks of two monolithic ICs 68.sub.1, 68.sub.2 each having a clock generation and distribution hereof and pairs of inter-IC connections E, F and G, H. The two ICs concerned will operate coherently, i.e. at the same frequency and with the same phase relationships, where each of the connections is substantially of 180-degrees electrical lengths, or a multiple satisfying 360.degree . . . n+180.degree. where n is zero or an integer.

A single pair of inter-IC connections (E, F or G, H) will result in frequency and phase 'locking'. More than one pair of inter-IC connections (E, F and G, H as shown) will result further in clock wave direction or rotation locking.

Also shown in FIG. 31 is a first and second 'stub' connections 82 and 83, though there could be more of either or each. The first stub connection 82 has a total electrical length of 180.degree. to assist in stabilizing operation. The second stub connection 83 is open-ended and also of 180.degree. electrical length and helpful for stabilization. Such stubs 82, 83 can be particularly useful for non-IC applications of the invention where conductive trace definition may be less precise than for ICs.

Impedance of the pairs of connections E, F and G, H and connections 82, 83 can have any value since, in normal operation and once these connections are energized, there will be no net power flow therein for correct phasing thereof. It is, however, preferred that the impedance of these connections E, F and G, H and 82, 83 is greater than that of oscillator transmission-lines 15 to which they are connected. These connections will support a standing EM wave rather than a traveling EM wave.

Such FIG. 31 inter-connections can be applied equally well to intra-IC, inter-IC, IC-to-PCB and/or any non-IC, i.e. PCB-to-PCB system connections.

Figure 32:
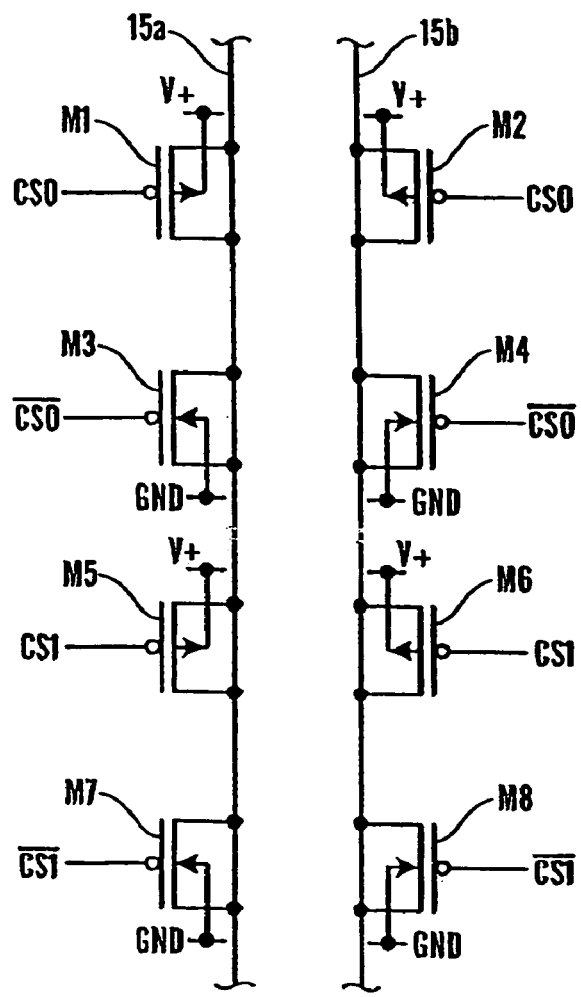
FIG. 32 shows digitally selectable shunt capacitors of Mosfet type.
Figure 33:
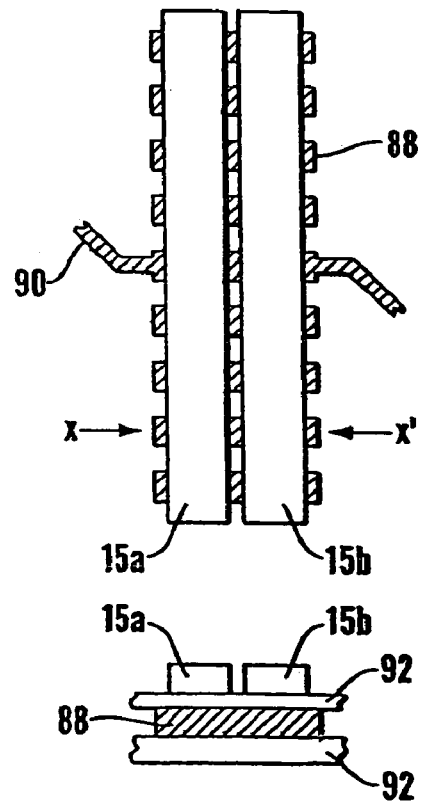
FIG. 33 shows capacitive loading and routing data and/or power across a transmission line.

FIG. 32 illustrates digitally selectable shunt capacitors that are formed out of mosfet transistors.

Digitally selectable shunt capacitors illustrated in FIG. 32 can be operatively connected to the transmission-line 15 and controlled for the traveling EM wave to be delayed slightly, i.e. the frequency of oscillation can be controlled. Such delays are useful for fine tuning the frequency of a transmission-line(s). As shown, eight shunt capacitors are implemented by means of mosfet transistors. The mosfets transistors M1, M2, M5 and M6 are PMOS transistors and mosfet transistors M3, M4, M7 and M8 are NMOS transistors.

The mosfets M1, M3, M5 and M7 have their drain and source terminals connected to the 'inner' transmission-line conductor 15a, for example, and the mosfets M2, M4, M6 and M8 have their drain and source terminals connected to the 'outer' transmission-line conductor 15b. The substrate terminals of mosfets M1, M2, M5 and M6 are connected to the positive supply rail V+ and the substrate terminals of mosfets M3, M4, M7 and M8 are connected to the negative supply rail GND.

The gate terminals of mosfets M1 and M2 are connected together and controlled by a control signal CS0 and the gate terminals of mosfets M3 and M4 are connected together and controlled by the inverse of control signal CS0. Likewise, the gate terminals of mosfets M5 and M6 are connected together and controlled by a control signal CS1 and the gate terminals of mosfets M7 and M8 are connected together and controlled by the inverse of control signal The following truth table illustrates which mosfet shunt capacitors (M1-M8) contribute capacitance, i.e. 'Mosfets On', to the transmission-line 15.

| CS0 | CS1 | Mosfets 'On' | Mosfets 'Off' |
|---|---|---|---|
| 0 | 0 | M1–M8 | — |
| 0 | 1 | M1–M4 | M5–M8 |
| 1 | 0 | M5–M8 | M1–M4 |
| 1 | 1 | — | M1–M8 |

It is preferred that the respective sizes and numbers of shunt capacitors connected to the 'inner' and 'outer' transmission-line conductive traces 15*a*, 15*b* are the same, i.e. balanced. Whilst eight mosfet shunt capacitors M1–M8 are shown, any number of mosfet shunt capacitors having suitable sizes, and hence capacitances, can be used, provided that the transmission-line 15 is balanced, as per FIG. 33.

There are other configurations for producing digitally controllable shunt capacitors that, may or may not be formed using mosfet transistors. One known example, again using mosfets, could be the use of binary weighted mosfet capacitors for example. Alternatives to MOS capacitors affording variable capacitance include varactors and PIN diodes for example.

It can be advantageous for the 'capacitor arrays' to be replicated at regular intervals around the transmission-line(s) so as to distribute the impedance.

The possibility is envisaged of achieving highest possible operating frequencies consistent with disconnectable switching of logic circuitry, including as semiconductor fabrication technology is bound to develop.

Indeed, transmission-line formations themselves should scale with IC process technology, thus smaller and faster transistor formations lead naturally to shorter and faster transmission-line oscillators for yet higher clock frequencies.

Other possibilities include maintaining low power consumption; regardless of applications, which could be as to any resonating of capacitive and inductive connections to a transmission-line, and specifically use relative to such as shift registers or 'precharge'/'evaluate' logic.

Whilst there is evident advantage in not having to use external timing reference such as a quartz crystal, nor PLL techniques, there may be situations and applications where this invention is applied in conjunction with such external timing crystals etc.

Figure 34:
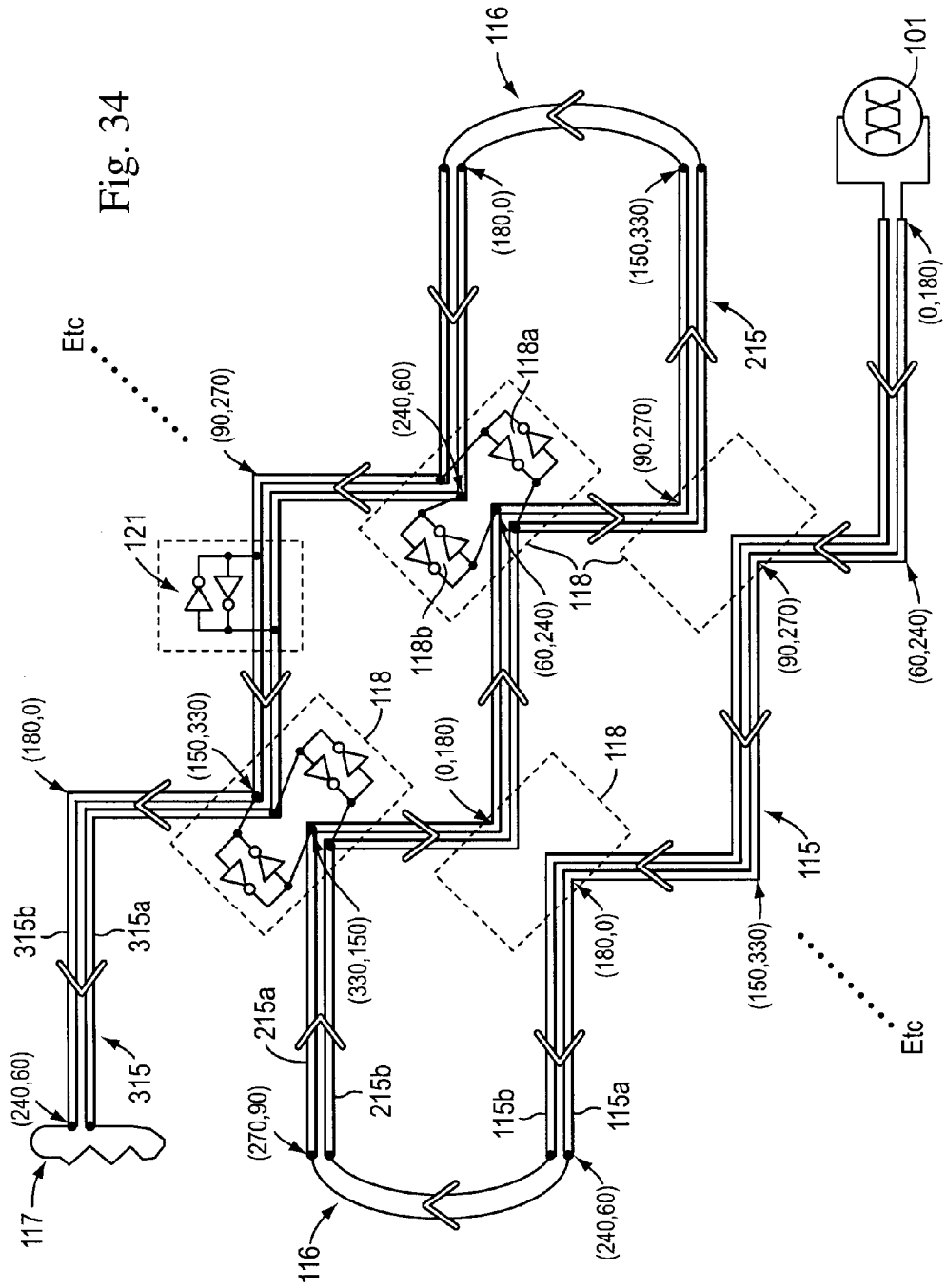
FIG. 34 is an outline circuit diagram for timing signal distribution using transmission lines with contra-flow action with synchronization.

Turning to FIG. 34, signal paths 115, 215, 315 are shown of a transmission line nature, specifically also of the parallel dual conductive component/trace type shown previously for FIG. 1, see a,b subscripting of 115, 215, 315.

Each of these transmission lines 115, 215, 315 has regenerative active means between its conductive traces, see bidirectional inverting switching/amplifying circuitry 121 shown between the traces 315*a,b* but only for the line 315 and only once therefore to avoid cluttering the drawing. As for FIGS. 1–33 embodiment, the circuitry 121 will be plural and distributed preferably substantially evenly along each of the transmission lines 115, 215, 315 in numbers and spacings affording operational effectiveness, up as many and as small as reasonably practical.

The transmission line signal paths 115, 215, 315 carry arrow-heads indicating unidirectionality of signal flow therein, and these signal/flow directions are different as between next adjacent paths specifically opposite from right-to-left and left-to-right sequentially up and down the drawing. These directions of signal flows could come from opposite end (left/right) application of a drive signal (101), or (as shown) result from optional loop connection links 116 from one path (see 115) receiving the drive signal to the next path (see 115–215) and onwards as desired (see 215–315), say in groups of signal paths (see 115–315) each with one path driven and others linked to achieve a successively contra-flow effect as illustrated. The last signal path so fed, whether of a group or overall, is terminated (see 117 for path 315). These links 116 are shown as being of passive loop connecting nature, as is generally adequate to their purpose. It is to be appreciated that what is shown in FIG. 34 is typically fragmentary of a much larger overall array, see dashed "etc" lines.

Importantly, a signal path with one direction of signal flow has cross-connection couplings to at least one other signal path with another direction of signal flow, see 118 between paths 215 and 315 having opposite unidirectional signal flows. As shown, these couplings 118 are at localized adjacencies of the signal paths concerned and will be of a non-linear active nature, say of switching transistor type or inverter type and advantageously bidirectional as specifically shown with inverters in back-to-back configuration.

The illustrated active nature of the cross-connections 118 usefully strengthens inter-coupling of the contra-flow signal paths concerned, including for gating signal flow energy to and from voltage sources and for mutual energy exchange, in fact generally supplies energy contributory to maintaining desired operation. The spacings of the cross-couplings 118 is further contributory to desired operation, specifically being at substantially equal electrical length intervals along each signal path that have prescribed phase correlation to signal flows in such paths, see bracketed phase numbers at 90.degree. intervals; and positions that reinforce phase correlations between the paths, see correspondence of bracketed phase numbers at the cross-connections 118.

The localized adjacencies, thus the cross-couplings 118, are shown at 180 degree phase intervals along the paths 115, 215, 315. The cross-couplings 118 are shown as bidirectional active nature, specifically back-to-back inverters much as for in-path connections 116, and in pairs (118*a,b*) between the transmission line conductor traces (see 215*a,b*) and 315*a,b*) of the different signal paths concerned (215, 315).

These bidirectional component conductor connections 118*a,b* are between the "a" conductors of one transmission line signal path and the "b" conductors of the other, respectively. This has the effect, for mutual energy transfer between the paths, of affording "cross-over" effects, thus usefully effectively recirculatory Moebius-twist signal paths that afford some degree of sustaining oscillation effect/action. The Moebius-twist signal paths comprise one part from one signal path and another from the other signal path, see for example between electrical phase positions (240, 60) and (150, 330) of the path 315, then (330, 150) and (60, 240) of the path 215.

This phase-locking will not be as strong, nor as power efficient as for the hard-wired connections of FIGS. 16 and 17, but there is in-principle viability for very fast and synchronized timing signal distributed over substantial areas without recourse to problematic H-tree distribution lay-out design; and as shown, inherently of differential nature according to input drive signal applied at 101, typically of square-wave form with its edges usefully maintained and refreshed by the cross connections 121.

Also, as for FIGS. 1–33, there is oscillation without resonance, i.e. repeating periodicity related to signal path traversal time and a requisite degree of feedback via the interconnections 118 (though less than for the hard-wiring of FIGS. 16, 17); inherent rotation-locking of signal flows; absence of in-series one-way amplifier provisions and their requirements for specific inputs and outputs; and phase-locking more simply than available by such as servo control action inherent in such as phase-locked loops. Moreover, there is significant energy conservation compared with such as H-tree distribution provisions as many more loads can be served for each energy-absorbing reflection-limiting termination 117 (though again less than for the electromagnetically continuously endless elements of FIGS. 1–33). Also, there will be useful energy exchanges with power supplies.

Figure 35A:
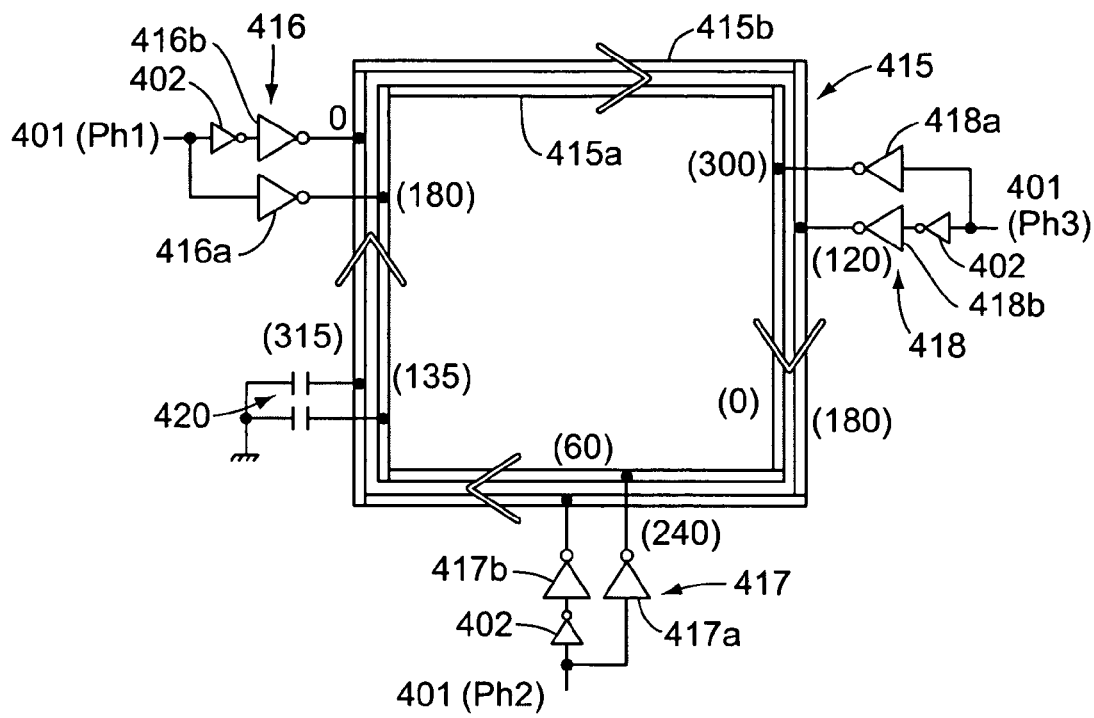
FIG. 35a is an outline circuit diagram for timing signal available without oscillation.
Figure 35B:
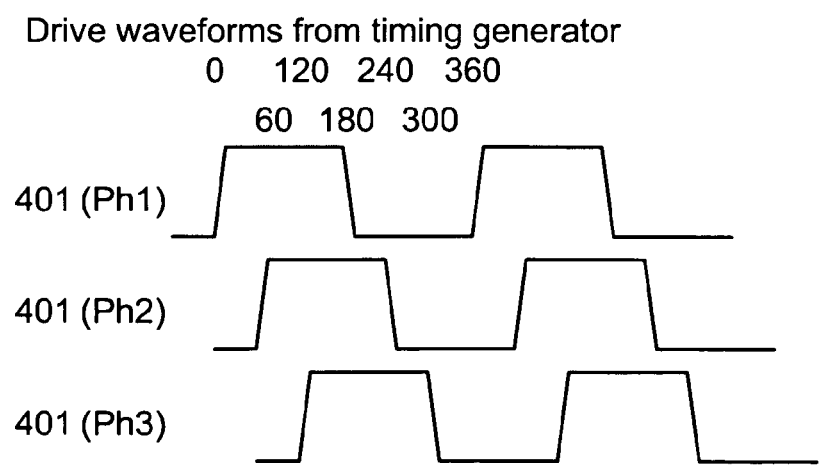

Turning to FIGS. 35*a* and 35*b* an endless electromagnetically continuous recirculatory signal path 415 is shown in FIG 35*a*, again of a transmission line nature, specifically comprising dual parallel component conductors/traces (415*a,b*), but now without a Moebius twist, thus without a cross-over or transformer to afford inversions. This is again shown reliant on drive signal 401, thus effectively as a means to distribute such timing signal through or about a localized area; and, as for all embodiments of this invention, is not reliant on any particular geometry, whether or area services or the signal path itself.

FIG. 35a has arrow heads showing a particular rotation direction for signal flow round the endless path 415, as can be imposed and maintained by illustrated active application of different phases of the drive signal (401), specifically for a differential timing signal continuously rotating round the path 415 with its opposite phases in the component paths 415a,b respectively, see inverters 402. Three phases of the drive signal 401 are shown at 120-degrees intervals (60, 180, 300), and the connection positions to the signal path 415 correspond in the context of that signal path 415 having an electrical length matching traveling wave full rotation time with the full 360-degree period of the drive signal 401.

Electrical energy for recirculatory signal flow round the path 415 is provided by active amplifying action in the application of the drive signal phases, see inverting coupling amplifiers 416, 417 and 418. These amplifiers 416, 417, 418 are in pairs subscripted a,b at each drive signal connection position, one to each component trace 415a,b in application and distribution of differential timing signals, so that opposite or inverted timing signals are available in the two separately endless component conductors 415a and 415b at any take-off position, see at 420 with respective phasing (135, 315).

Relative to FIG. 35a non-differential (or single-ended) operation is, of course, readily available by omission of the loop conductor/trace 415b and the drive signal connections through inverters 402 and amplifiers 416b, 417b and 418b.

Whilst detailing herein has been within the context of currently dominant CMOS technology for ICs, it will be appreciated by those skilled in the art that principles are involved that are also applicable to other semiconductor technologies, e.g. Silicon-Germanium (Si—Ge), Gallium-Arsenide (Ga—As) etc.

Finally, highly beneficial particular utility in overcoming the problems associated with high frequency clocking, e.g. where F>1 GHz, no other applicability of combined timing signal generation and distribution is to be excluded from intended scope hereof, say for systems and apparatus to operate at frequencies less than 1 GHz.

What is claimed is:

1. A clock distribution system comprising:
a plurality of transmission line segments, each segment having ends and a length of spaced apart first and second conductors therebetween, each length of conductor being electrically continuous;
a plurality of passive connection means coupling the ends of the one or more segments to form a serpentine sequence of segments, the serpentine sequence being configured to provide positions at which adjacent segments are physically proximate and phase-correlated, the open end of the first segment in the sequence for receiving an oscillator that provides a pair of oppositely phased clock signals, the open end of the last segment in the sequence for connecting to a load device;
a plurality of regeneration devices located at various spaced-apart positions on each of the segments and connected between the first and second conductors of the segment; and
a plurality of regeneration device pairs, each located at one of the physically proximate, phase-correlated positions between adjacent segments, wherein a first one of the pair is connected between the first conductor of one segment and the second conductor of the adjacent segment and a second one of the pair is connected between the second conductor of the one segment and the first conductor of the adjacent segment, and wherein, when driven by the oscillator, adjacent transmission line segments have unidirectional waves traveling in opposite directions.

2. A clock distribution system as recited in claim 1, wherein each regeneration device includes a first inverter and a second inverter, each having an input and an output, the input of the first inverter connected to the output of the second inverter and the input of the second inverter connected to the output of the first inverter.

3. A clock distribution system as recited in claim 1, wherein each of the regeneration device pairs,
wherein each regeneration device pair includes two regeneration devices; and
wherein each regeneration device includes a first inverter and a second inverter, each having an input and an output, the input of the first inverter connected to the output of the second inverter and the input of the second inverter connected to the output of the first inverter.

4. A clock distribution system as recited in claim 1, wherein each of the passive connection means includes a pair of wire links.

5. A clock distribution system as recited in claim 1, wherein the plurality of regeneration devices is nearly evenly distributed along each of the segments.

6. A clock distribution system as recited in claim 1, wherein the load device is resistive.

7. A clock distribution system as recited in claim 1,
wherein each of the segments has an impedance; and
wherein the load device has an impedance that is matched to the impedance of the last segment.

8. A clock distribution system as recited in claim 1, wherein phase correlated positions between adjacent segments are 60 degrees on one segment and 240 degrees on the adjacent segment.

9. A clock distribution system as recited in claim 1, wherein phase correlated positions between adjacent segments are 90 degrees on one segment and 270 degrees on the adjacent segment.

10. A clock distribution system as recited in claim 1, wherein phase correlated positions between adjacent segments are 180 degrees on one segment and 0 degrees on the adjacent segment.

11. A clock distribution system as recited in claim 1, wherein phase correlated positions between adjacent segments are 330 degrees on one segment and 150 degrees on the adjacent segment.

* * * * *